(12) United States Patent
Petrovic et al.

(10) Patent No.: US 8,345,798 B2
(45) Date of Patent: Jan. 1, 2013

(54) CHANNEL STACKING SYSTEM AND METHOD OF OPERATION

(75) Inventors: Branislav Petrovic, La Jolla, CA (US); Itzhak Gurantz, San Diego, CA (US); Keith Bargroff, San Diego, CA (US)

(73) Assignee: Entropic Communications, Inc., San Diego, CA (US)

( * ) Notice: Subject to any disclaimer, the term of this patent is extended or adjusted under 35 U.S.C. 154(b) by 753 days.

(21) Appl. No.: 12/414,892

(22) Filed: Mar. 31, 2009

(65) Prior Publication Data
US 2009/0290659 A1  Nov. 26, 2009

Related U.S. Application Data

(60) Provisional application No. 61/054,886, filed on May 21, 2008.

(51) Int. Cl.
*H03K 9/00* (2006.01)
(52) U.S. Cl. .............................. 375/316; 329/372
(58) Field of Classification Search .................. 375/316; 32/315, 372; 329/315, 372
See application file for complete search history.

(56) References Cited

U.S. PATENT DOCUMENTS

| | | | |
|---|---|---|---|
| 5,293,382 A * | 3/1994 | Carson et al. ................. | 370/210 |
| 6,301,465 B1 | 10/2001 | Kintis et al. | |
| 6,353,490 B1 * | 3/2002 | Singer et al. .................... | 398/66 |
| 6,424,817 B1 | 7/2002 | Hadden et al. | |
| 2005/0190777 A1 | 9/2005 | Hess et al. | |
| 2005/0193419 A1 | 9/2005 | Lindstrom et al. | |
| 2008/0112385 A1 * | 5/2008 | Bargroff et al. ............... | 370/343 |
| 2008/0178227 A1 * | 7/2008 | Petrovic et al. ................. | 725/68 |
| 2008/0303739 A1 * | 12/2008 | Sharon et al. ................. | 343/876 |

\* cited by examiner

*Primary Examiner* — Shuwang Liu
*Assistant Examiner* — David Huang
(74) *Attorney, Agent, or Firm* — Bruce Greenhaus; Duane Morris LLP

(57) ABSTRACT

A channel stacking system includes first and second downconverting stages, first and second analog to digital converters, and a digital switching and signal processor. The first downconverting stage includes a first downconverter circuit having an input for receiving a first RF input signal which includes a multitude of first channels. The first downconverter circuit frequency downconverts the first RF input signal to a first IF signal which includes the multitude of first channels. The first analog-to-digital converter converts the first IF signal to a first digital IF signal. The second downconverter stage includes a second downconverter circuit having an input for receiving a second RF input signal which includes a multitude of second channels. The second downconverter circuit frequency downconverts the second RF input signal to a second IF signal including said multitude of second channels.

19 Claims, 14 Drawing Sheets

CHANNEL STACKING SYSTEM AND METHOD OF OPERATION

CROSS-REFERENCE TO RELATED APPLICATIONS

The present Application for Patent claims priority to Provisional Application No. 61/054,886 entitled "Channel Stacking System and Method of Operation" filed May 21, 2008, and assigned to the assignee hereof and hereby expressly incorporated by reference herein.

FIELD OF DISCLOSURE

The disclosed method and apparatus relates to systems and methods for constructing composite signals, and more specifically, to systems and methods for assembling a desired sequence of channels to form a composite signal.

BACKGROUND

Many residential buildings, especially older ones, have legacy cable infrastructures that can make it difficult to cost-effectively distribute high-bandwidth services. Residents of such buildings, desiring high-definition (HD) video and/or high-speed data communication services, can rely on channel stacking systems to leverage existing cable infrastructures for providing these modern services.

As shown in FIG. 1, a channel stacking system 1200 may receive a plurality of signals 1210 from M sources 1205. In the typical channel stacking system, the signal sources are satellites, however, such signals may be provided by other sources. Each signal 1210 may contain multiple channels of information which are frequency division multiplexed within a given bandwidth. Each band is typically modulated on an RF carrier frequency, which may or may not be common among the sources. Based upon control signals 1225 provided by receivers 1215, the channel stacking system 1200 will process the incoming signals 1210 and extract channels of interest. The extracted channels will then be assembled (i.e., stacked) into a new composite signal 1220 suitable for transmission along a single cable. This is sometimes referred to as sequencing the channels. The channels of the composite signal 1220 are also frequency division multiplexed so that each of the receivers 1215 (which are configured to receive programming at a designated frequency within the composite signal 1220) may receive the channel requested by its respective user via the control signals 1215.

In FIG. 2, further details are presented which exemplify the signal processing operations of a conventional channel stacking system receiver 1230. A plurality of RF signals 1232 may be received by one or more antennas (not shown) and passed to an analog preprocessing stage 1233. The analog preprocessing stage initially amplifies the received signals with one or more low noise amplifiers, and then band-pass filters the entire band to reject out of band noise. The signals are then provided to a first analog downconversion stage 1234, which downconverts each signal to relatively lower RF signal (e.g., from Ku-band to L-band). This lower RF signal is then coupled to a second analog downconversion stage 1236 which downconverts the signal to an intermediate frequency (IF) $f_{IF}$ using analog techniques. The output from the analog downconversion stage 1236 is shown in a magnitude response diagram 1246 of FIG. 2. In one embodiment, the downconverted signals are then digitized by an analog-to-digital converter stage 1238. The digitized signals are then provided to a digital switching and filtering/selection stage 1240. In this stage, a digital switch (not shown) selects the appropriate signal source based upon the desired channel. Once the appropriate signal source is selected, digital filters (not shown) are used to extract the channel of interest, as shown in a magnitude response diagram 1248 of FIG. 2. The signals are then passed to an upconversion and digital-to-analog conversion stage 1242 which translates each selected channel to an appropriate output frequency $f_{oR}$, as shown in a magnitude response diagram 1250 of FIG. 2. The output frequency for each channel is selected to correspond to the frequency assigned to the requesting receiver. Each upconverted channel is then assembled (sequenced) into a composite signal using an analog summer. The composite signal, an example of which is shown in a magnitude response diagram 1252 of FIG. 2, is centered at $f_o$ and has a bandwidth appropriate for transmission along a single cable.

As noted above, present channel stacking system satellite receivers typically employ multiple downconversion processes. For example, a conventional channel stacking system receiver may employ a two stage downconversion process; a first downconversion in the low noise block (LNB) stage, and a second downconversion at the IF stage. Multi-downconversion systems typically suffer from the disadvantages of increased circuit complexity and high power consumption.

Furthermore, as described above, selecting and extracting channels from multiple sources (e.g., satellites) and assembling these channels into a desired sequence presently employs analog techniques. Such processing is more advantageously done in the digital domain without the need for bandpass filtering or Hilbert Transformers.

SUMMARY

A system and method for channel stacking is disclosed. In one embodiment, a channel stacking system uses a single downconverter stage to downconvert a received RF signal directly to an intermediate frequency (IF) signal rather than first converting the received signal to an L-band or other such lower RF signal. The use of a single analog domain downconversion of the input RF signal generates a composite digital signal having the desired sequence. A Digital Signal Switching and Pre-processing (DSSP) stage performs channel selection, extraction and sequencing within the digital domain. The channel extraction and conversion circuit generates a composite digital signal having a desired channel sequence.

One embodiment includes first and second downconverters, first and second analog to digital converters, and a digital switching and signal processing stage. The first downconverter has an input for receiving a first RF input signal. The RF input signal includes a multitude of first channels. The first downconverter frequency downconverts the first RF input signal directly to a first IF signal using a single analog RF to IF frequency translation. The first IF signal includes the channels that were received in the first RF input signal. The first analog-to-digital converter converts the first IF signal to a first digital IF signal. The second downconverter has an input for receiving a second RF input signal that includes a multitude of second channels. The second downconverter frequency downconverts the second RF input signal directly to a second IF signal using a single analog RF to IF frequency translation. The second IF signal includes the second channels that were received in the second RF input signal. The second analog-to-digital converter converts the second IF signal to a second digital IF signal. The digital switching and signal processing stage receives each of the first and second digital IF signals, and assembles at least one of the first channels and at least one of the second channels into a digital composite signal.

BRIEF DESCRIPTION OF THE DRAWINGS

The accompanying drawings are presented to aid in the description of disclosed embodiments and are provided solely for illustration of the embodiments and not as a limitation thereof.

DETAILED DESCRIPTION

The following description and related drawings disclose specific embodiments of channel stacking systems. However by disclosure of these embodiments, those skilled in the art will understand that alternative embodiments exist as well. Additionally, well-known elements of the disclosed system will not be described in detail or will be completely omitted so as not to obscure the relevant details of the disclosed systems.

The terminology used herein is for the purpose of describing particular disclosed embodiments only and is not intended to limit the scope of the claims appended hereto. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, some embodiments may be described in terms of sequences of actions to be performed by, for example, elements of a computing device. It will be recognized that various actions described herein can be performed by specific circuits (e.g., discrete circuitry or application specific integrated circuits (ASICs)), by program instructions being executed by one or more processors, or by a combination of both processors executing instructions and dedicated circuits. Additionally, the sequences of actions described herein can be embodied entirely within any form of computer readable storage medium that, upon execution, would cause an associated processor to perform the functions described herein. Thus, the various aspects of the disclosed embodiments may take on a number of different forms, all of which have been contemplated to be within the scope of the claimed subject matter.

Figure 1:
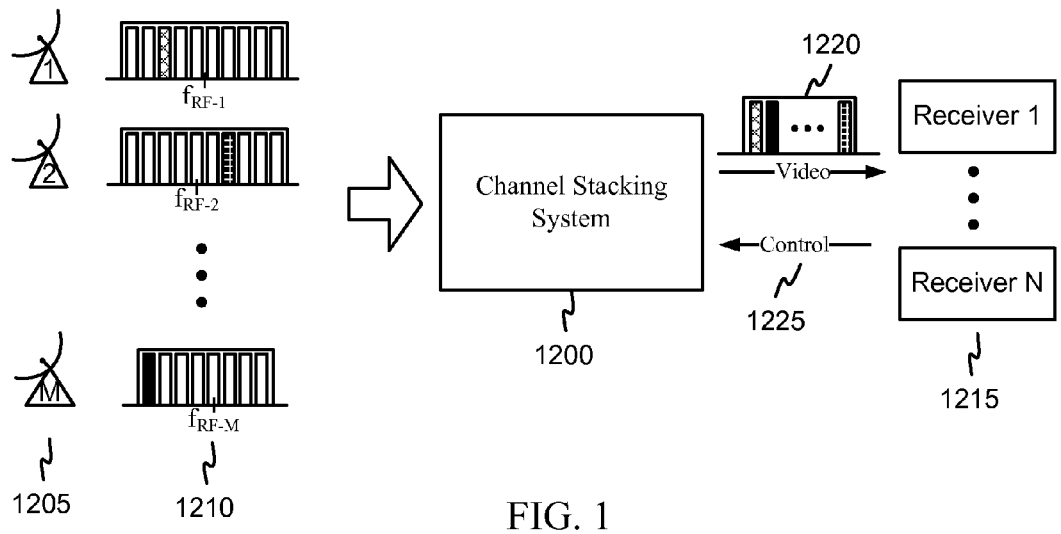
FIG. 1 illustrates a top level block diagram for a receiving system employing conventional channel stacking system.
Figure 2:
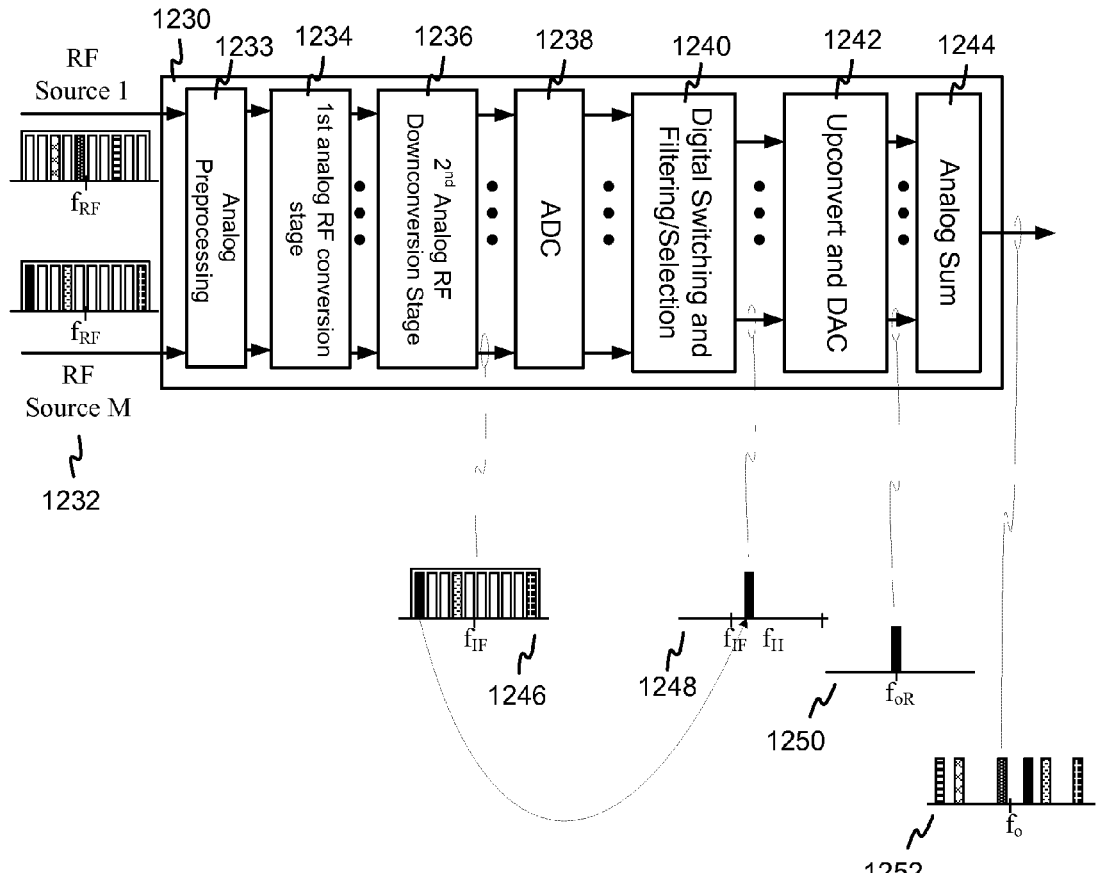
FIG. 2 illustrates signal processing operations for a conventional channel stacking system.
Figure 3:
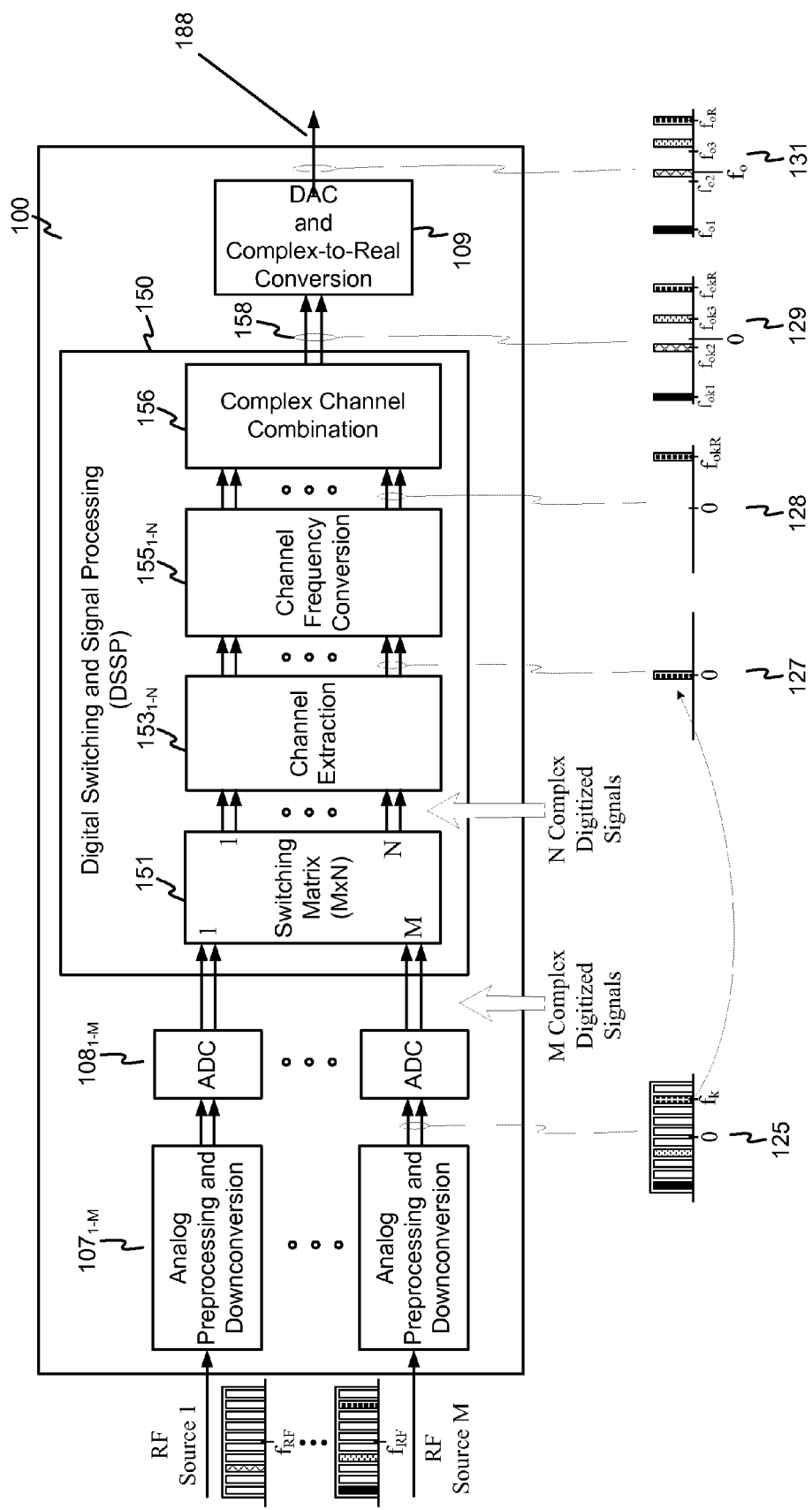
FIG. 3 illustrates a top-level architecture and signal diagrams for a channel stacking system.
Figure 4:
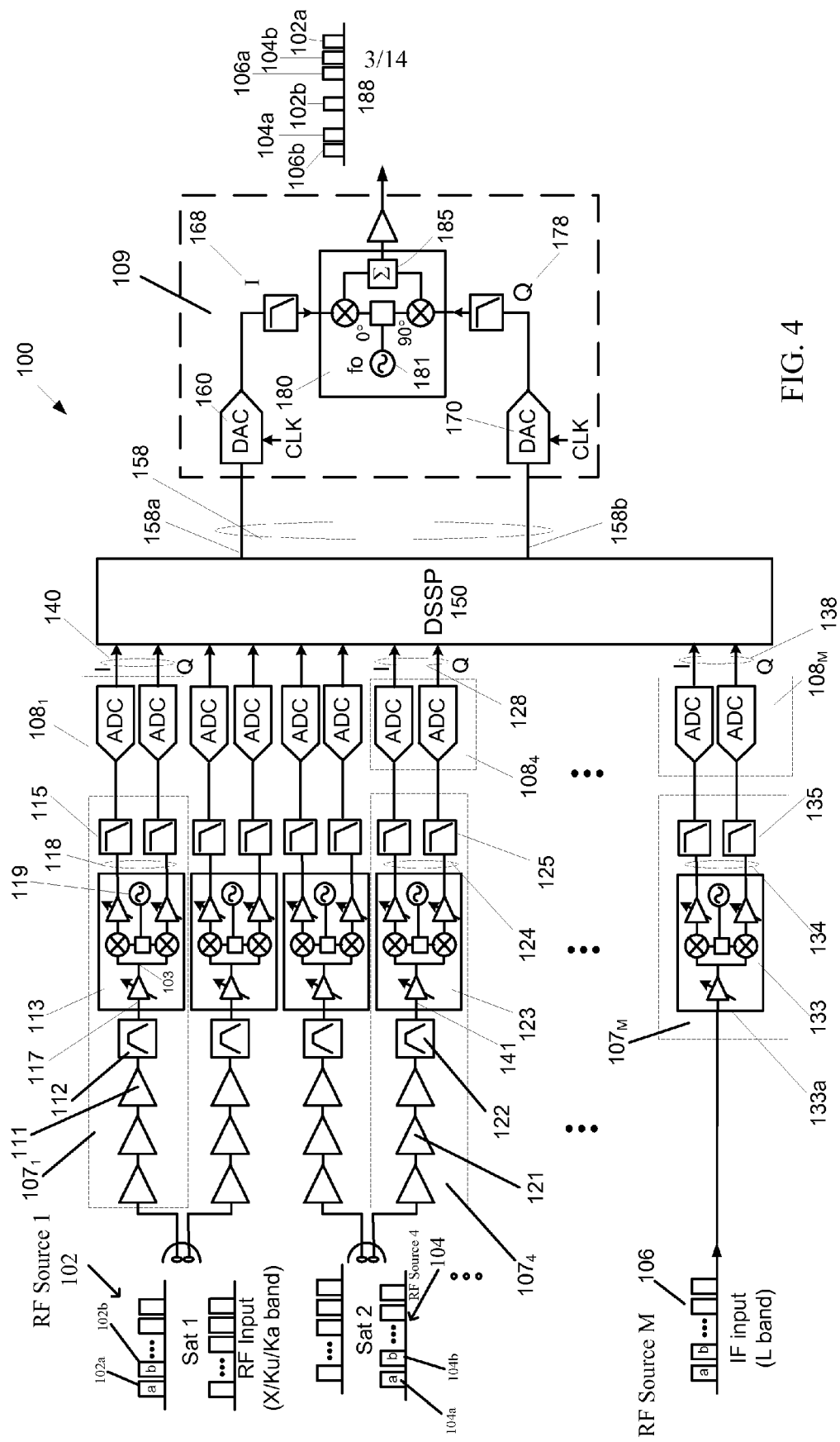
FIG. 4 illustrates further details for the channel stacking system.

FIG. 3 illustrates a top-level architecture and signal diagrams for a channel stacking system 100. FIG. 4 depicts further implementation details for implementing the channel stacking system 100. The system 100 operates to "stack" or assemble channels resident within an RF signal into a composite signal in which the received channels are placed (or sequenced) in desired channel slots for output to a rendering device, such as a set-top box, or other receiver/tuner. The system 100 uses a single RF downconversion to bring the received signals from RF down to intermediate frequency (IF). The IF signals are then digitized to allow the remainder of the processing to be done in the digital domain. Once the signals have been selected and properly stacked, the output of the system 100 is converted back to the analog domain and upconverted to an appropriate RF signal.

Signals 102, 104, 106 are received from a plurality of RF Sources (1 through M). The number of first or second channels included in the RF input signals 102, 104, 106 and/or the respective bandwidths of the received signals may vary. For example, for the RF input signal 102, the total channel bandwidth may be in the range of 100 MHz-5 GHz, or more particularly between 500 MHz-2 GHz. As an example, there may be 28 channels, each at 40 MHz wide, or alternatively 40 channels, each channel 29 MHz wide. In one embodiment, signals are received from a 500 MHz wide satellite signal that includes 16 channels (i.e. one per satellite transponder). Each channel is 29 MHz wide. 2 GHz wide satellites typically employ 60 transponders per polarization, each channel ranging in bandwidth generally from 6-30 MHz, typically with one channel per transponder. The number of channels included in any particular received signal 102 may be 4, 6, 8, 16, 24, 28, 32, 40, 48, 60, 120 or more.

In one embodiment of the disclosed system, an "RF signal" is a signal having a center frequency above the frequency range of 3 GHz. RF signals may include signals having a center frequency within the range of 3-40 GHz. In another embodiment, more particularly in the range of 5-30 GHz, and in yet another embodiment, even more particularly in the range of 8-26 GHz. In one embodiment, RF signals include X/Ku/Ka-band signals which may be received from orbital satellites. The X/Ku/Ka bands are exemplified by the frequency ranges of 7 GHz to 12.5 GHz for X-band, 10.7 GHz-12.75 GHz for Ku-band, and 17.3 GHz-20.3 GHz for Ka-band. However, it should be understood by those skilled in the art that in alternative embodiments, an RF signal can be at far lower or higher frequencies.

Further, in one embodiment, an "IF signal" is a signal having a center frequency below the frequency range of 3 GHz, including baseband (0 Hz center frequency) signals. In one particular embodiment, IF signals include signals having a center frequency within the range of 0-2.5 GHz, more particularly, 0-1 GHz, and more particularly 0-500 MHz. As the skilled person will appreciate, the modulation/channel information included within the IF signal will extend beyond the center frequency of the IF signal, and the bandwidth of the IF signal may extend several hundreds of megahertz, a gigahertz, or more. However, in such embodiments, the IF center frequency will typically be below 3 GHz as defined above. In one embodiment, IF signals include L-band signals (e.g., 950

MHz-2150 MHz) which are received from another system that that has already downconverted a satellite signal. In another embodiment, an "IF signal" refers to a signal that has undergone a previous frequency translation within the disclosed channel stacking system, and an RF signal refers to a signal that has not undergone a previous frequency translation within the channel stacking system of the disclosed system. However, those skilled in the art will understand that in an alternative embodiment, an IF signal may be any signal that is relatively lower in frequency than the RF signal and has not been frequency translated within the disclosed channel stacking system.

As seen in FIGS. 3 and 4, each signal 102, 104, 106 is coupled to a respective one of the analog preprocessing and downconversion (APD) stages $107_{1-M}$. In one embodiment, one or more of the APD stages 107 comprises an amplifier 111, 121 that initially amplifies the received signal (see FIG. 4). In addition, filters 112, 122 within some of the APD stages 107, band-pass filter the entire band to reject out of band noise. In embodiments in which the total bandwidth is 2 GHz wide, each of the RF and IF filters provide 2 GHz of passband in order to ensure that all received channels pass to a Digital Switching and Signal Processing stage (DSSP) 150. In one embodiment, the RF and IF filters 112 and 115 have a fixed passband width or center (or cutoff) frequency. In an alternative embodiment, the RF and/or IF filters 112, 115 have a passband which is variable. In yet another embodiment, the bandwidth may be less than the total bandwidth. In one such embodiment, one or more of the filters 112, 115 attenuate/reject at least one of the received channels. In one embodiment, the RF and/or IF filters 112, 115 may be tunable and have a passband suited to pass only one channel. Such amplification and filtering is optional and in one embodiment of the disclosed method and apparatus is not included in all of the APD stages 107 and in one embodiment, is not included in any of the APD stages 107.

Each of the APD stages 107 downconverts the signal to baseband (i.e., centered around 0 Hz). A first downconverter 113 frequency downconverts the first RF input signal 102 to a first IF signal 118. The downconverted first IF signal 118 includes the plurality of first channels 102a, 102b, etc. carried in the received RF signal 102.

The downconversion to baseband is performed using one analog mixing operation (i.e., using only a single frequency translation), during which the signal having only "real" components (i.e., no "imaginary" components) is converted into a complex representation having a real I (in-phase) component and an imaginary Q (quadrature) component. In one embodiment of the disclosed method and apparatus, the spectrum of the signal output from each APD stage 107 is centered at a frequency of zero Hertz, as is shown in a magnitude response diagram 125 in FIG. 3.

FIG. 4 illustrates details not shown in FIG. 3 regarding the APD stages 107 and the digital to analog converter (DAC) and Complex-to-Real Conversion stage 109 of a channel stacking system 100. The disclosed system is not limited in the number of parallel downconverting stages employed. Accordingly, the system 100 may include any plurality of parallel APD stages, for example, 2, 3, 4, 6, 8, 16, 24, 32, 48, 60, 120, or more. In alternate embodiments, a single APD stage having a plurality of channels for each RF source can alternatively be used.

Figure 5:
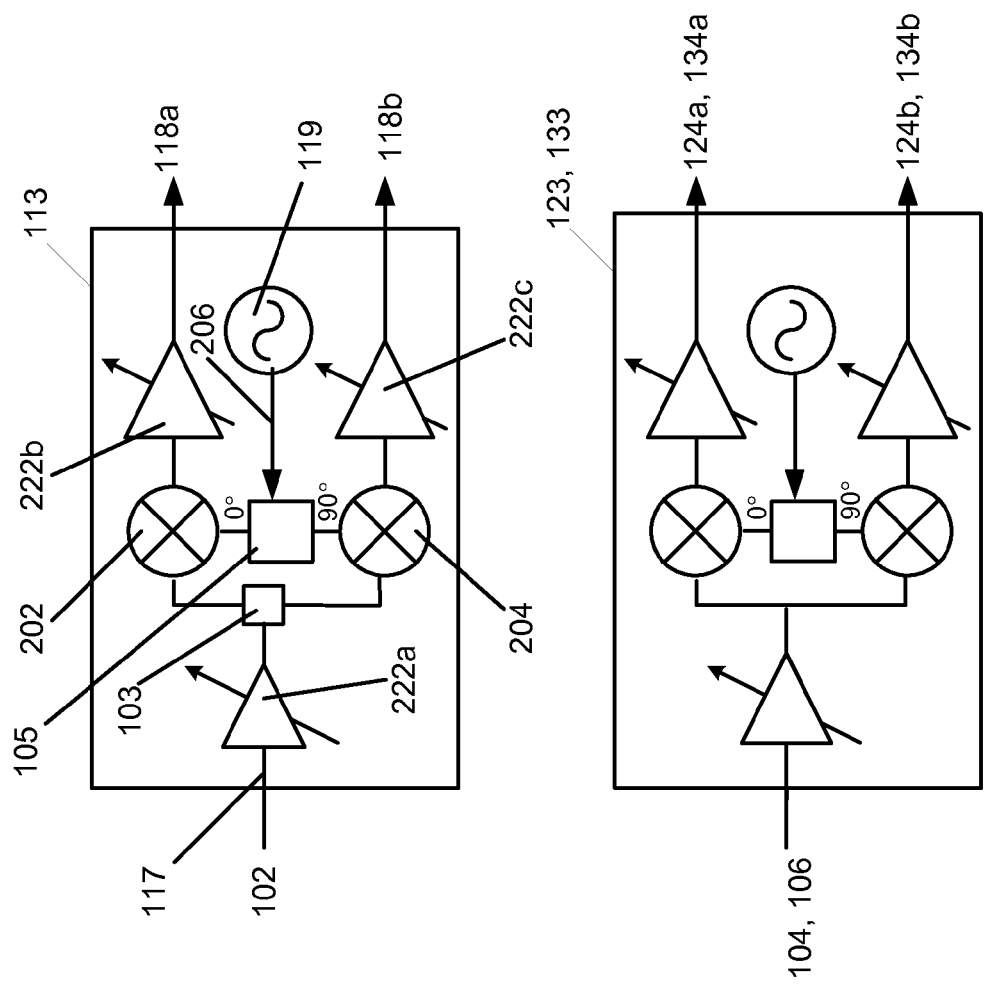
FIG. 5 illustrates the first and second downconverter circuits shown in the channel stacking system of FIG. 4.

A first APD stage $107_1$ includes the first downconverter 113 shown in greater detail in FIG. 5. The first downconverter 113 has an input 117 for receiving a first RF input signal 102 including a plurality of first channels 102a, 102b, etc., (as shown in FIG. 4).

As shown in FIG. 5, the downconverter 113 includes a frequency source 119, a 90-degree phase shifter 105 (e.g., a 90-degree hybrid coupler), mixers 202 and 204, signal splitter 103, and amplifiers 222a-c. Input signal 102 is amplified, split and coupled to each mixer 202 and 204. The frequency source 119 provides a reference frequency 206 to the 90-degree phase shifter 105. The shifter 105 supplies a 0-degree phase shifted version of the reference frequency 206 to the local oscillator port of the mixer 202 and a relative 90-degree phase shifted version of the reference frequency 206 to the local oscillator port of the mixer 204. In one embodiment the frequency source 119 is fixed. In an alternative embodiment, the frequency source 119 is variable. The frequency source 119 may be set to provide a signal 206 of any particular reference frequency. In one embodiment, the frequency source 119 provides a signal 206 at a frequency for directly downconverting the input signal 102 to baseband (zero IF). In another embodiment, the frequency source 119 provides a signal 206 at a frequency for downconverting the input signal 102 to low IF. In accordance with this embodiment the IF signals have a center frequency that is offset from 0 Hz. In one such embodiment, the entire IF signal bandwidth lies above direct current (DC), as described further below. Typically the low end of the signal bandwidth is placed near DC (but excludes the DC and it's immediate close-by frequencies, typically a range of a few hundred kHz or a few MHz, to avoid the adverse effects of low frequency flicker noise and/or DC leakage terms), in order to minimize the occupied frequency range, thus minimizing the ADC sampling rate.

The outputs of the mixers 202 and 204 are coupled to amplifiers 222b and 222c, respectively. The outputs from the amplifiers 222b, 222c are quadrature phase downconverted signals 118a and 118b.

Referring back to FIG. 4, the signals 118 and 124 are filtered in I and Q anti-aliasing filters 115 and 125, and then digitized by ADC pairs $108_1$ and $108_4$, respectively, to produce digitized signals 140 and 128. The digitized signals 140 and 128 are then coupled to the DSSP 150. Each of these signals includes at least one of the channels that were present when the incoming RF signals 102, 104 were received. Also, it is worth noting that the entire band from each of the complex signals provided by the APD stages $107_{1-M}$ is digitized by analog-to-digital converters $108_{1-M}$.

Upon receiving the digitized signals, the DSSP 150 performs all its switching and signal processing functions within the digital domain. In one particular embodiment of the disclosed system, the DSSP 150 is implemented as a digital signal processor. In another embodiment, the DSSP 150 is an application specific integrated circuit (ASIC), which may include a Radio-Frequency IC (RFIC). Those skilled in the art will appreciate that other circuits/devices (e.g., programmable gate arrays, etc.) may be used to implement the below-described functions of the DSSP 150, and accordingly, such alternatives, or any combinations thereof, may be implemented as well for the DSSP 150.

As shown in FIG. 3, the DSSP 150 includes a matrix switching stage 151, a channel extraction stage 153, a channel frequency conversion stage 155, and a complex channel combination stage 156. In one embodiment, the digitized signals are first provided to the switching matrix 151. The switching matrix 151 can simultaneously select each of the M complex digitized signal inputs, and route each input signal to one or more of the N complex digitized outputs. Typically, the number of digitized outputs N is greater than or equal to the number of receivers (not shown) connected to the output of the channel stacking system 100.

Once the signal sources have each been routed to the appropriate input to the channel extraction stage 153 by the switching matrix 151, channel extraction stages 153 I-N will extract the channels of interest from the baseband input signals (i.e., remove all of the channels that are not of interest). In one embodiment of the disclosed method and apparatus, this is done by first having the channel extraction stage 153 digitally translate the desired channel to baseband. Note that in some embodiments of the disclosed method and apparatus, the channel is already at baseband. In that case, this frequency translation does not take place. The translated channels are then digitally lowpass filtered to suppress any in-band channels that are not of interest, leaving only the channel of interest. The magnitude response diagram 127, corresponding to one of the pairs of I and Q outputs from the channel extraction stage 153, shows the channel of interest, originally centered at $f_k$, having been downconverted to baseband and the other channels that are not of interest having been filtered out of the signal.

The extracted baseband channels (one per output from the channel extraction stage 153) are then provided to channel frequency conversion stages $155_{1-N}$ where each channel is upconverted from baseband to a non-zero center frequency. In one embodiment, each of these non-zero center frequencies is uniquely associated with one of the receivers (not shown). As shown in the magnitude response diagram 128 in FIG. 3, the channel of interest corresponding to the $N^{th}$ switched output is upconverted to $f_{okR}$, where $f_{okR}$ is the frequency to which the signal is to be moved (i.e., upconverted) for reception by receiver R. Accordingly, each channel is upconverted to its non-zero center frequency $f_{oki}$, where the index "i" is a value from 1 to R representing the receivers from 1 to R. The channels are then combined in the complex channel combination stage 156. Here, all of the channels are summed into one combined complex signal 158 shown by a magnitude response diagram 129 and centered at baseband.

Once this combined complex signal is output from the DSSP 150, it is provided to the DAC and complex-to-real conversion stage 109. This stage 109 initially converts the I and Q channels into analog signals, and then converts the I and Q component signals into a real signal 188. During this conversion, the signal is upconverted to a center frequency $f_o$, with each channel centered at a frequency corresponding to the receiver that requested the channel. This output signal 188 is a composite signal as shown in the magnitude response diagram 131 of FIG. 3. The output signal is centered at $f_o$, and has a bandwidth appropriate for transmission along a single cable.

By limiting the number of frequency downconversions and performing much of the processing in the digital domain, the quality of the composite signal may be improved over those produced by conventional techniques. Moreover, much of the filtering is done in the digital domain which permits better control of the quality of the filtering. Consequently, more channels may be stacked onto the composite signal, thus making better use of the limited bandwidth of the single output cable.

The DSSP 150 assembles at least one of the first channels 102a, 102b and at least one of the second channels 104a, 104b into a digital composite signal 158 illustrated in the magnitude response diagram 129 shown in FIG. 3. Further details regarding the operation of the DSSP 150 are provided below with regard to FIGS. 6 and 7.

The second APD stage $107_4$ is constructed similarly to the first APD stage $107_1$, and optionally includes an RF stage amplifier 121, an RF filter 122, and an IF filter 125, each of which may be of the same construction, type, and operation as the corresponding components of the first APD stage $107_1$. The second APD stage $107_4$ also includes a second downconverter 123 having an input 141 for receiving a second RF input signal 104 including a plurality of second channels 104a, 104b. The second downconverter 123 frequency downconverts the second RF input signal 104 to a second analog IF signal 124 that includes the plurality of second channels 104a, 104b. As is the case with the first downconverter circuit 113, in one embodiment, the second downconverter 123 provides quadrature phase (I and Q) signals. In such an embodiment, the second IF signal 128 is a quadrature phase signal pair. The output of the second APD stage $107_4$ is coupled a second ADC $108_4$ that converts the second IF signal 124 to a second digital IF signal 128.

In one embodiment, each APD stage 107 performs a single analog domain downconversion. In one such embodiment, the downconverter 113, 123, 133 within the APD stage 107 is the only analog domain downconverter for downconverting the RF input signal 102, 104, 106 into an IF signal 118, 124, 134 in the channel stacking system. However, in alternative embodiments, other analog domain downconverters may be provided. In one embodiment of the disclosed system, the first, second, and third IF signals 118, 124, and 134 operate at substantially the same IF frequency.

Several different downconverter architectures may be employed in accordance with the disclosed system. In one embodiment, the APD stage $107_1$ provides quadrature phase (I and Q) downconverted signals to allow subsequent image rejection, when, for example, the reference signal 206 generated by the frequency source 119 places image signals within the band of the downconverted IF signals 118 and 124. In a particular embodiment, the frequency of the reference signal 206 (See FIG. 5) is selected to be at the center of the modulation bandwidth of the RF input signal. This selection relaxes the output filtering to a corresponding one-half of the modulation bandwidth by folding the modulation bandwidth around zero frequency. Quadrature downconversion allows these signals to be recovered, as will be made clear below.

The system 100 also includes a third APD stage $107_M$. The third APD stage $107_M$ includes a third downconverter 133 having an input 133a for receiving a third RF input signal 106 including a plurality of third channels 106a, 106b. The third downconverter 133 frequency downconverts the third RF input signal 106 to a third IF signal 134 including the plurality of second channels 106a, 106b. The third downconverting stage further includes a third analog-to-digital converter $108_M$ that converts the third IF signal 134 to a third digital IF signal 138. However, as can be seen from FIG. 4, the third APD stage $107_M$ does not have amplification and filtering prior to the downconverter 133. In one embodiment disclosed below, the third APD stage $107_M$ can be used to receive the output 188 from another channel stacking system 100 (i.e., to cascade systems). Accordingly, the third APD stage $107_M$ may be set up to accept an L-band signal output from another such channel stacking system (See FIG. 11 and the accompanying discussion below).

The output of the first APD stage $107_1$ is coupled to a first analog-to-digital converter (ADC) $108_1$ that converts the first analog IF signal 118 to a first digital IF signal 140. It should be noted that the first digital IF signal 140 is a complex signal having both and in-phase (I) and quadrature (Q) components. The ADC $108_1$ may be of a conventional design to provide a sufficient amount of signal resolution, e.g., at least 4 bits wide using a clocking frequency at or above the Nyquist rate determined by the downconverted signal supplied thereto.

Also shown in FIG. 4, the first, second or third ADCs $108_1$, $108_4$ and $108_M$ of one embodiment are realized as pairs of ADCs. Each pair has one ADC dedicated to processing the in-phase (I) component of the IF signal. The second ADC of the pair is dedicated to processing the Q component of the complex IF signal 118, 124 and 134. In one embodiment, these ADCs 108 are of a conventional design to provide a sufficient amount of signal resolution (e.g., at least 4 bits wide using a clocking frequency at or above the Nyquist rate as determined by the downconverted signal supplied to the ADC 108). Filters (e.g. lowpass filters) 115, 125, 135 may be implemented prior to the ADCs to attenuate any out-of-band interference and prevent aliasing.

As noted above, DSSP 150 receives each of the first and second digital IF signals 140, 128, 138. The DSSP 150 assembles at least one of the first channels 102a, 102b and at least one of the second channels 104a, 104b into a composite signal 158, provided in one embodiment as a pair of quadrature phase signals 158a, 158b.

In one embodiment of the disclosed channel stacking system 100, DAC and Complex to Real Conversion stage 109 returns the composite signal to the analog domain and/or re-modulates the signal to a format compliant with a desired signal protocol or standard. For example, in one embodiment of the disclosed system, the DAC and Complex to Real Conversion stage 109 places the output signal 158 in a format of that complies with the "Multimedia over Coax Alliance" (MoCA) standard, or Ethernet IP TV. In the embodiment shown in FIG. 4, the system 100 includes first and second DACs 160, 170, and an upconverter 180. The first and second DACs 160, 170 receive a respective one of the digital quadrature phase signals 158a, 158b and respective clock signals. Each DAC 160, 170 produces a respective one of two quadrature phase analog composite signals 168, 178. The upconverter 180 receives both quadrature phase composite analog signals 168, 178, and produces an upconverted composite signal 188. In one embodiment, the DSSP 150 outputs quadrature phase signals 158a, 158b at baseband, and the upconverter 180 frequency translates the quadrature phase composite signals 168, 178 from baseband to the L-band frequency range. L-band is useful for feeding into a receiver, such as a television set top box (STB) or the like. Of course, the upconverter can provide translations to other frequencies as well. Signal demodulation can be performed, followed by remodulation in a different format, such as quadrature amplitude modulation. The channel stacking system 100 may be implemented as an outdoor unit (ODU) as part of a satellite receiving system, such a system provided proximate to the satellite antenna.

Figure 6:
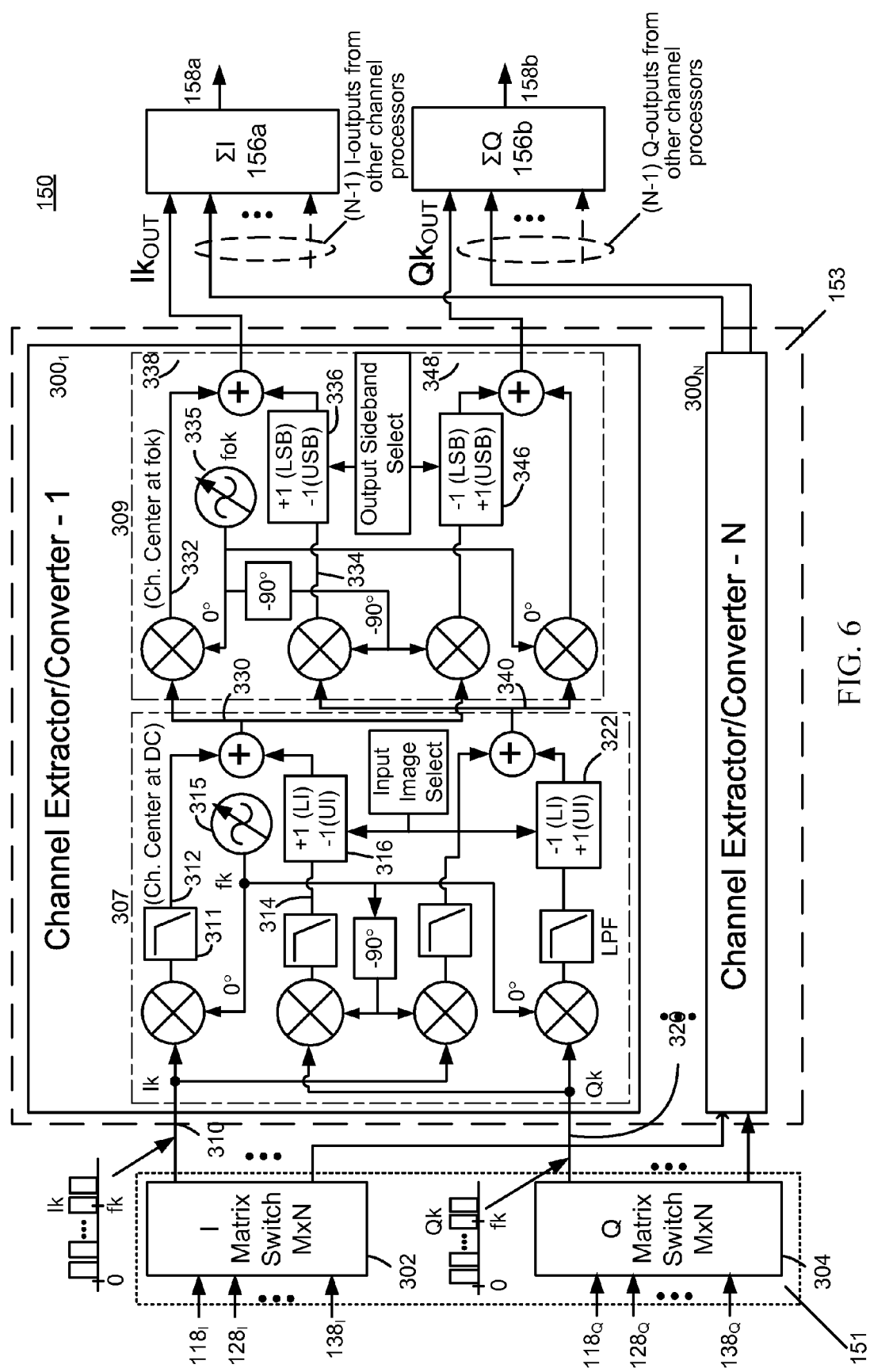
FIGS. 6 and 7 illustrate embodiments of the digital switching and signal processing stage 150 shown in the channel stacking system of FIG. 4.
Figure 7:
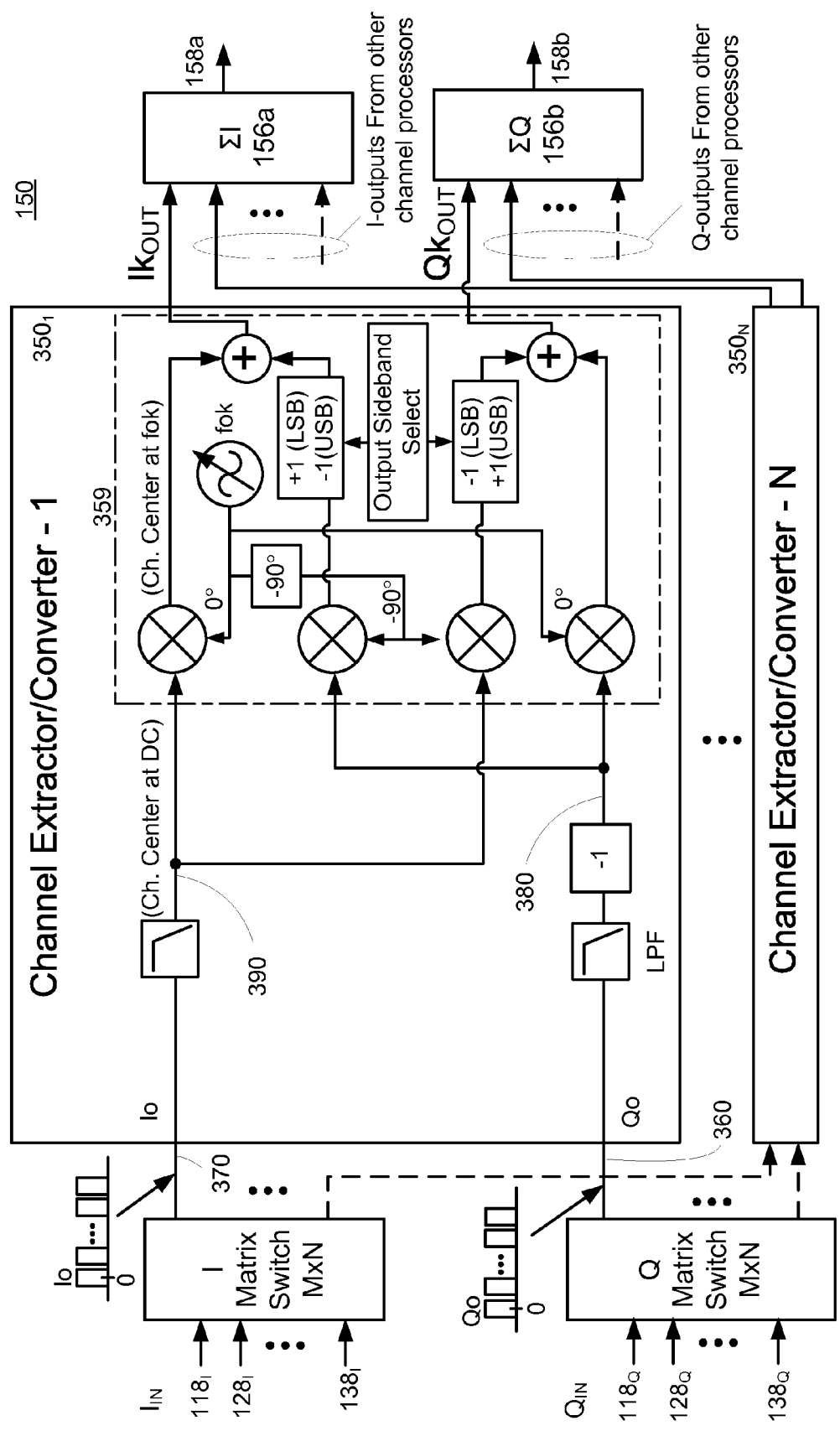

FIGS. 6 and 7 illustrate embodiments of the DSSP 150 shown in the channel stacking system of FIG. 4. In one particular embodiment, the switching matrix 151 of the DSSP 150 includes respective I and Q switch matrices 302 and 304 and one or more (N shown) channel extractor/converter circuits 300 within the channel extractor stage 153. As will be described in further detail below, the channel extractor/converter circuits 300, 350 extract a desired channel and locate or place the channel in the desired channel slot of the output signal 158. In one embodiment, the number of channel extractor/converter circuits will be equal to the number of available channels (i.e., channel slots) in the output signal 158 (e.g., 4, 6, 8, 16, 24, 28, 32, 40, 48, 60, 120 or more channels), although in other embodiments a larger or smaller number of channel extractor/converter circuits may be employed within the DSSP 150 as well. Further, in one embodiment of the disclosed system 100, the DSSP 150 employs both types of channel extractor/converter circuits 300 and 350. Alternatively, the system 100 has either of the circuits 300 or 350, as will be further described below.

In one embodiment of the system 100, the spectrum at the I and Q outputs of the APD stage 107$_1$ of FIG. 4 is folded around DC, because the LO frequency falls inside the input signal band, typically in the middle of the input bandwidth. Because of this spectral folding, both the I and Q signals contain a linear combination of the channels originating from the image frequencies at Ka/Ku Band (images are in respect to the RF LO source 119 at Ku/Ka frequency): LI (Lower Image) and UI (Upper Image). The channel extraction and placement method in the disclosed system is accomplished in two steps: the first step is to extract the desired image (either LI or UI) channels from the incoming signals, and the second step is to upconvert and place these channels at the desired output frequency.

Two cases may be considered under the foregoing conditions: in a first case, when the frequency of the RF LO 119 is located in-between two RF channels (i.e. transponders), and a second case, when the frequency of the RF LO 119 falls inside the bandwidth of a channel/transponder.

FIG. 6 shows an embodiment of the DSSP 150 employing a channel extractor/converter circuit 300 configured for the first case, when the RF LO is in-between two channels (i.e., the zero intermediate frequency (ZIF) output is folded at DC, in-between channels). The channel extractor/converter circuit 300 includes two processing stages 307 and 309, each of which is further described below. FIG. 7 shows an embodiment of the DSSP 150 employing a channel extractor/converter 350 in the second case, i.e., when the RF LO falls inside of a channel (the channel is then folded around DC at ZIF output). A preferred location of the LO frequency in this case is around the middle of the channel. In this embodiment, the channel extractor/converter circuit 350 includes processing stage 359, which in an embodiment that is identical to processing stage 309 of the channel extractor/converter circuit 300 illustrated in FIG. 6. For example, the same digital circuit (e.g., channel extractor/converter circuit 300 of FIG. 6) can be used for both channel extractor/converter circuits 300 and 350, for instance, by bypassing the first stage 307 to configure circuit 300 into that of circuit 350, or reconfiguring the circuit into 300 from the circuit 350 configuration, as may be desired. The reconfiguration in this case means either engaging or bypassing stage 307, using, for example, digital multiplexers or switches when a digital signal processor is the platform.

Channel extraction from the incoming signal and placement to the desired output frequency/channel slot can be explained with the help of the following analysis.

Designating the angular frequency of the LO source 119 in FIG. 4 with $\omega_{RF}$, the LI and UI channels of the incoming RF satellite signal (at point 103 in APD stage 107$_1$) can be represented with:

$$\cos(\omega_{RF}-\omega_{LI})t + \cos(\omega_{RF}+\omega_{UI})t \qquad (1)$$

Where $\omega_{LI}=\omega_{UI}$, representing the angular frequencies of the image channels relative to the LO frequency $\omega_{RF}$, equally spaced from this LO frequency. The first term in equation (1) represents the lower image (LI) channel, and the second term the upper image (UI) channel, measured in respect to the LO frequency $\omega_{RF}$.

Regarding the channel extractor/converter embodiment shown in FIG. 6, the in-phase signal Ik 310 and the quadrature signal Qk 320 are obtained by downconverting the satellite signals in the APD stages 107 shown in FIGS. 3 and 4. Downconversion is accomplished by multiplying the satellite signals with the in-phase and quadrature LO signals, then low-pass filtering in anti-aliasing filters and digitizing the signals in the ADCs and then selecting/routing the desired signal source by the switching matrix 302 and 304. While the signals Ik 310 and Qk 320 at this point are digital, for the purpose of analysis the signals can be expressed with the following equations (for simplicity, scale factors such as ½, 2, etc. have been omitted in all equations):

The in-phase signal Ik at 310:

$$[\cos(\omega_{RF}-\omega_{LI})t+\cos(\omega_{RF}+\omega_{UI})t]\cdot\cos(\omega_{RF}t)=\cos(\omega_{LI}t)+\cos(\omega_{UI}t) \quad (2)$$

Where the sum frequency terms $\sim 2\cdot\omega_{RF}$ are removed because the signal is low pass filtered.

Similarly, the quadrature signal Qk at 320:

$$[\cos(\omega_{RF}-\omega_{LI})t+\cos(\omega_{RF}+\omega_{UI})t]\cdot\cos(\omega_{RF}t-90°)=\cos(\omega_{LI}t-90°)+\cos(\omega_{UI}t+90°) \quad (3)$$

From eqs. (2) and (3) it can be seen that the Ik and Qk terms contain a linear combination of two channels falling on the same frequency $\omega_{LI}$ or $\omega_{UI}$ ($\omega_{LI}=\omega_{UI}$), originating from image frequencies at Ka/Ku band.

Next, with a digital LO signal 315 at the frequency $f_k$ (corresponding to angular frequency $\omega_k$, which is selected to be equal to $\omega_{LI}$ and $\omega_{UI}$: $\omega_k \approx \omega_{LI} = \omega_{UI}$, i.e. $\omega_k$ is in the middle of the channel bandwidth represented by $\omega_{LI}$ or $\omega_{UI}$), the Ik and Qk are downconverted to zero IF as follows:

The in-phase signal Ik from 310 is converted to zero IF by multiplying the right-hand side of eq. (2) by the in-phase LO=$\cos(\omega_k t)$ and low-pass filtering in 311, which removes the sum terms, the signal at 312 is then:

$$\cos(\omega_{LI}-\omega_k)t+\cos(\omega_{UI}-\omega_k)t \quad (4)$$

The quadrature signal Qk from 320 is downconverted by multiplying the right-hand side of eq. (3) by quadrature LO=$\cos(\omega_k t-90°)$ and low-pass filtering, yielding at 314:

$$\cos(\omega_{LI}-\omega_k)t-\cos(\omega_{UI}-\omega_k)t \quad (5)$$

The cutoff frequency of the low pass filters (311) are set at about half the channel bandwidth, so that the difference terms containing folded channel bandwidth are passed, while the sum terms at $\sim 2\cdot\omega_k$ are removed.

Selecting the +sign (+1) in 316 and summing eqs. (4) and (5) yields the lower image LI at 330:

$$\cos(\omega_{LI}-\omega_k)t \quad (6)$$

If the minus sign (−1) is selected in 316, the upper image UI is obtained at 330:

$$\cos(\omega_{UI}-\omega_k)t \quad (7)$$

In a similar way it can be shown that at 340 obtained are signals that are in quadrature with those represented by eqs. (6) or (7). Selecting the minus sign (−1) in 322 yields:

$$\cos[(\omega_{LI}-\omega_k)t-90°] \quad (8)$$

or, selecting the plus sign (+1) in 322 provides:

$$\cos[(\omega_{UI}-\omega_k)t-90°] \quad (9)$$

Eq. (6) and (8) represent the quadrature pair of the LI signal, and eq. (7) and (9) are the quadrature pair of the UI signal at zero IF frequency in the digital domain.

To simplify the further analysis, the above two equations pairs can be consolidated into one equation pair by substituting the difference frequencies ($\omega_{LI}-\omega_k$) or ($\omega_{UI}-\omega_k$) with $\Delta\omega_k$:

$$\cos(\Delta\omega_k t) \quad (10)$$

$$\cos(\Delta\omega_k t-90°) \quad (11)$$

where $\Delta\omega_k=\omega_{LI}-\omega_k$ or $\Delta\omega_k=\omega_{UI}-\omega_k$ (12)

and since $\omega_k \approx \omega_{LI} = \omega_{UI}$, the $\Delta\omega_k \approx 0$, i.e. the $\Delta\omega_k$ represents zero IF, with signal bandwidth folded around DC.

Eqs. (10) and (11) represent either the LI or the UI quadrature pair at 330/340, depending upon which input image has been selected. This completes the first stage of processing—the channel extraction.

Next, the second step—the placement of these signals to the output frequency is performed. This is accomplished by upconverting the quadrature pair expressed with eq. (10) and (11) to the output frequency by multiplication with quadrature digital LO 335 (which is variable) at frequency $f_{ok}$ of angular frequency $\omega_{ok}$:

At the output of the upper mixer, at point 332 the signal is:

$$\cos(\omega_{ok}-\Delta\omega_k)t+\cos(\omega_{ok}+\Delta\omega_k)t \quad (13)$$

And at point 334:

$$\cos(\omega_{ok}-\Delta\omega_k)t-\cos(\omega_{ok}+\Delta\omega_k)t \quad (14)$$

Selecting the +sign (+1) in 336 and summing eqs. (13) and (14) yields at 338:

$$\cos(\omega_{ok}-\Delta\omega_k)t \quad (15)$$

If the minus sign (−1) is selected in 336, at 338 obtained is:

$$\cos(\omega_{ok}+\Delta\omega_k)t \quad (16)$$

Similarly, it can be shown that at 348 the following is obtained:

With 346 set to −1:

$$\cos[(\omega_{ok}-\Delta\omega_k)t+90°] \quad (17)$$

and with 346 set to +1:

$$\cos[(\omega_{ok}+\Delta\omega_k)t-90°] \quad (18)$$

Equations (15) and (17) represent the $Ik_{out}$, $Qk_{out}$ pair at 338/348 which, after passing through the combiners 156a/156b and DACs 160/170, will yield the LSB sideband at the final output after upconversion in the quadrature upconverter 180 of FIG. 4, and equations (16) and (18) represent the pair that will yield the USB sideband at the final output, as analyzed next.

Multiplying eq. (15) and (17) with corresponding quadrature components of the LO 181 in FIG. 4 at frequency fo (angular frequency $\omega_o$) and combining the products in the summing circuit 185 yields:

$$\cos(\omega_{ok}-\Delta\omega_k)t\cdot\cos(\omega_o t)-\cos[(\omega_{ok}-\Delta\omega_k)t+90°]\cdot\cos(\omega_o t-90°)=\cos(\omega_o-\omega_{ok}+\Delta\omega_k)t \quad (19)$$

which represents the LSB sideband at the output frequency: $\omega_{out}=\omega_o-\omega_{ok}$.

Similarly, multiplying the pair of eqs. (16) and (18) with quadrature LO 181 and combining the terms:

$$\cos(\omega_{ok}+\Delta\omega_k)t\cdot\cos(\omega_o t)-\cos[(\omega_{ok}+\Delta\omega_k)t-90°]\cdot\cos(\omega_o t-90°)=\cos(\omega_o+\omega_{ok}+\Delta\omega_k)t \quad (20)$$

which is the USB sideband at the output frequency: $\omega_{out}=\omega_o+\omega_{ok}$.

From eq. (19) or (20), it can be seen that the frequency $f_{ok}$ of the digital oscillator 335 in FIG. 6 represents the distance of the desired output frequency from the LO frequency $f_o$, above or below the $f_o$.

Regarding the channel extractor/converter embodiment circuit of FIG. 7, this embodiment shows the circuit configuration of the channel extractor/converter 350 when the RF LO falls in the middle of a channel, when the channel after downconversion is folded around DC at ZIF output. In this case the input frequency $\omega_{in}$ is equal to the RF LO 10 frequency, i.e. $\omega_{in} \approx \omega_{RF}$ or $(\omega_{in}-\omega_{RF}) \approx 0$. Designating $\omega_{in}-\omega_{RF}=\Delta\omega_o$, the in-phase downconverted, digitized and lowpass-filtered signal at 390 inside the channel extractor/converter 350 can be expressed with:

$$\cos(\Delta\omega_o t) \quad (21)$$

Similarly, the quadrature signal at 380 is:

$$\cos(\Delta\omega_o t - 90°) \quad (22)$$

The cutoff frequency of the low pass filters (375) are set at about half the channel bandwidth, so that the difference terms containing folded desired channel bandwidth is passed, while all other channels are removed, resulting in only one term remaining in eq. (21) and (22), representing the desired channel.

Equation pair (21), (22) is identical to eq. pair (10), (11), meaning that the format of the signals at 390/360 in the channel extractor/converter 350 are identical to the signals 330/340 in the channel extractor/converter 300, which in turns means that the subsequent processing of these signals and therefore the circuitry in the channel extractor/converter 350 is identical to that of the channel extractor/converter 300.

As can be seen, no bandpass channel filters and no Hilbert Transformers are used. Also, separate I and Q summers (156a, 156b, respectively) are used. Because low pass filters are used instead of bandpass filters, filter and circuit complexity are relaxed. The absence of Hilbert transformers provides advantages in that circuit complexity and power consumption are reduced.

Figure 8:
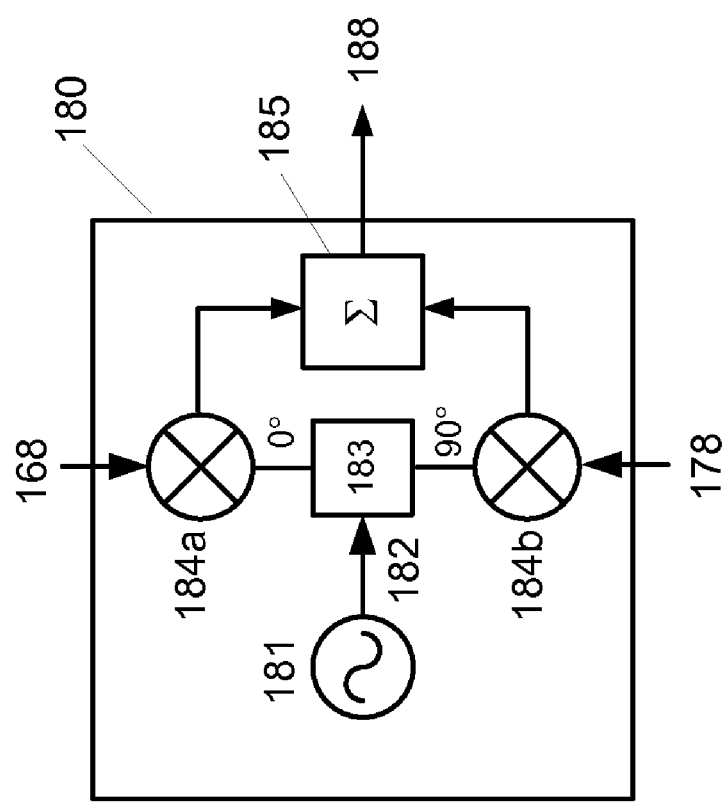
FIG. 8 illustrates the upconverter circuit shown in the channel stacking system of FIG. 4.

FIG. 8 illustrates an upconverter circuit 180 shown in the channel stacking system of FIG. 4. The upconverter 180 includes a frequency source 181 (which may be fixed or variable frequency) that provides a reference frequency 182 to a 90-degree phase shifter 183, the phase shifter 183 providing substantially quadrature phase versions of the reference signal to mixers 184a and 184b. The mixers 184a and 184b also receive respective analog quadrature phase composite signals 168 and 178 (after anti-aliasing filtering) to produce upconverted signals that are summed by means of a signal combiner 185 to produce an upconverted composite signal 188. The upconverted composite signal 188 may be supplied to a receiver, such as a set top box, or another channel stacking system, whereby additional channels are added to those within the composite signal 188. This latter embodiment of the disclosed system is further described below and illustrated in FIGS. 10 and 11.

Figure 9:
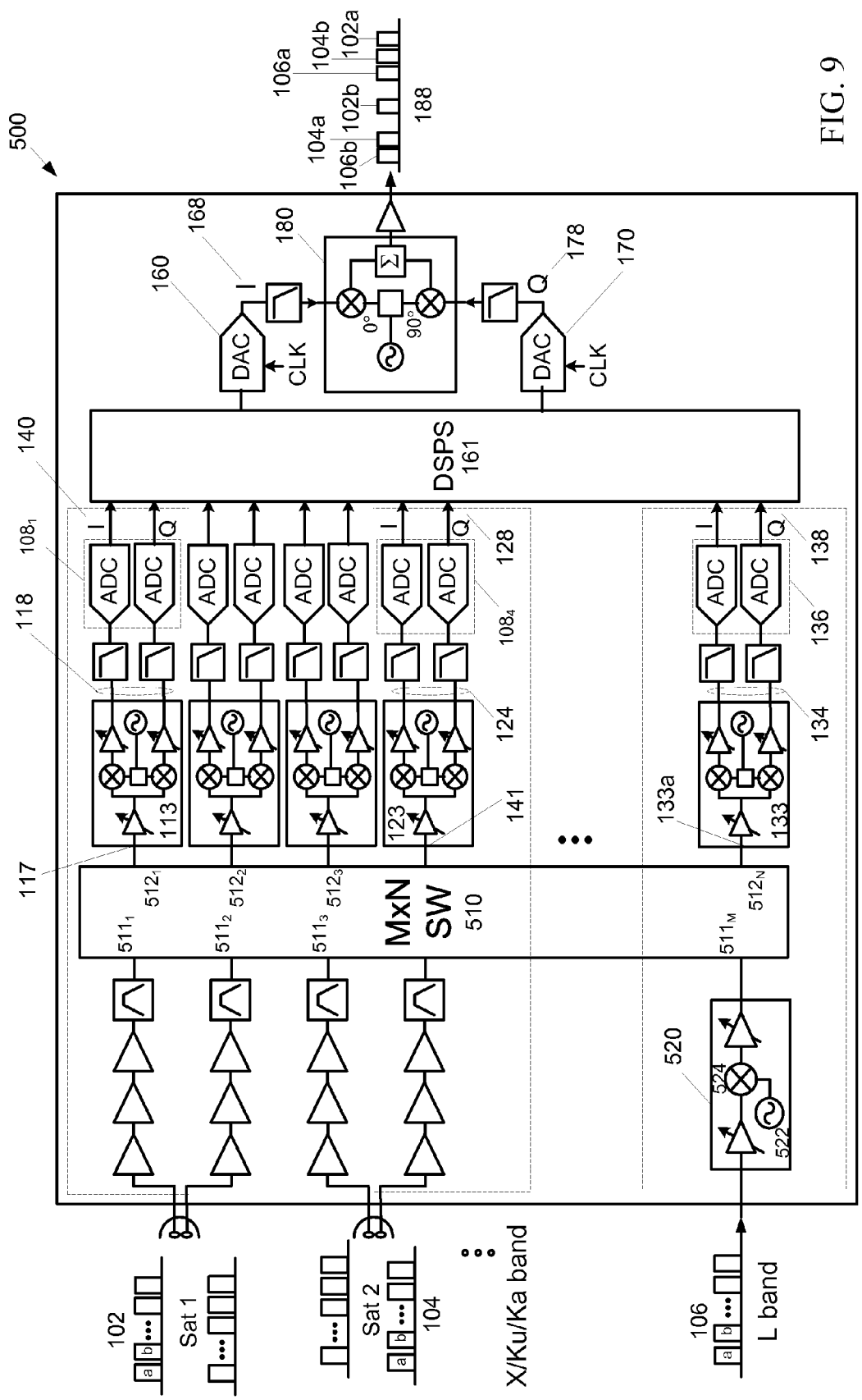
FIG. 9 illustrates a second embodiment of a channel stacking system.

FIG. 9 illustrates a second embodiment of a channel stacking system 500, with previously-identified features retaining the same reference indicia. The system 500 has a pre-down-conversion switching matrix 510 and a frequency translation module 520. The switching matrix 510 includes a plurality of inputs $511_1$-$511_M$ that receive each of the first and second input signals 102, 104, 106 and a plurality of outputs $512_1$-$512_N$. The switching matrix 510 couples any of the signals received at any of the switching matrix inputs to any one or more of the switching matrix outputs, thereby providing flexible channel distribution and creating diverse composite signals 158, 168, 178 and 188. In this embodiment, the DSSP 150 of system 100 is replaced with a digital signal processing stage (DSPS) 161. The DSPS 161 performs all of the signal processing tasks of DSSP 150 except for the switching, which in this embodiment is performed in the analog domain by the switching matrix 510. The DSPS 161 may be implemented using any type of hardware and/or software executed on any type of appropriate processor(s) (e.g., a programmable digital signal processor).

The frequency translation module 520 frequency translates an externally-supplied signal 106 to the desired input frequency of the switching matrix 510. In a particular embodiment, the externally-supplied signal 106 is an L-band signal, in which the frequency translation module is used to upconvert signal 106 to a frequency in the range of signals 102 and 104 (i.e., X/Ku/Ka-band frequency ranges). Furthermore, frequency translation module 520 may be omitted if the input signal 106 is within the desired input frequency range of the switching matrix 510 and of the downconverters. In this embodiment, the Channel Extractor/Converter inside the DSSP 150 is configured per FIG. 7, configuration 350.

Figure 10:
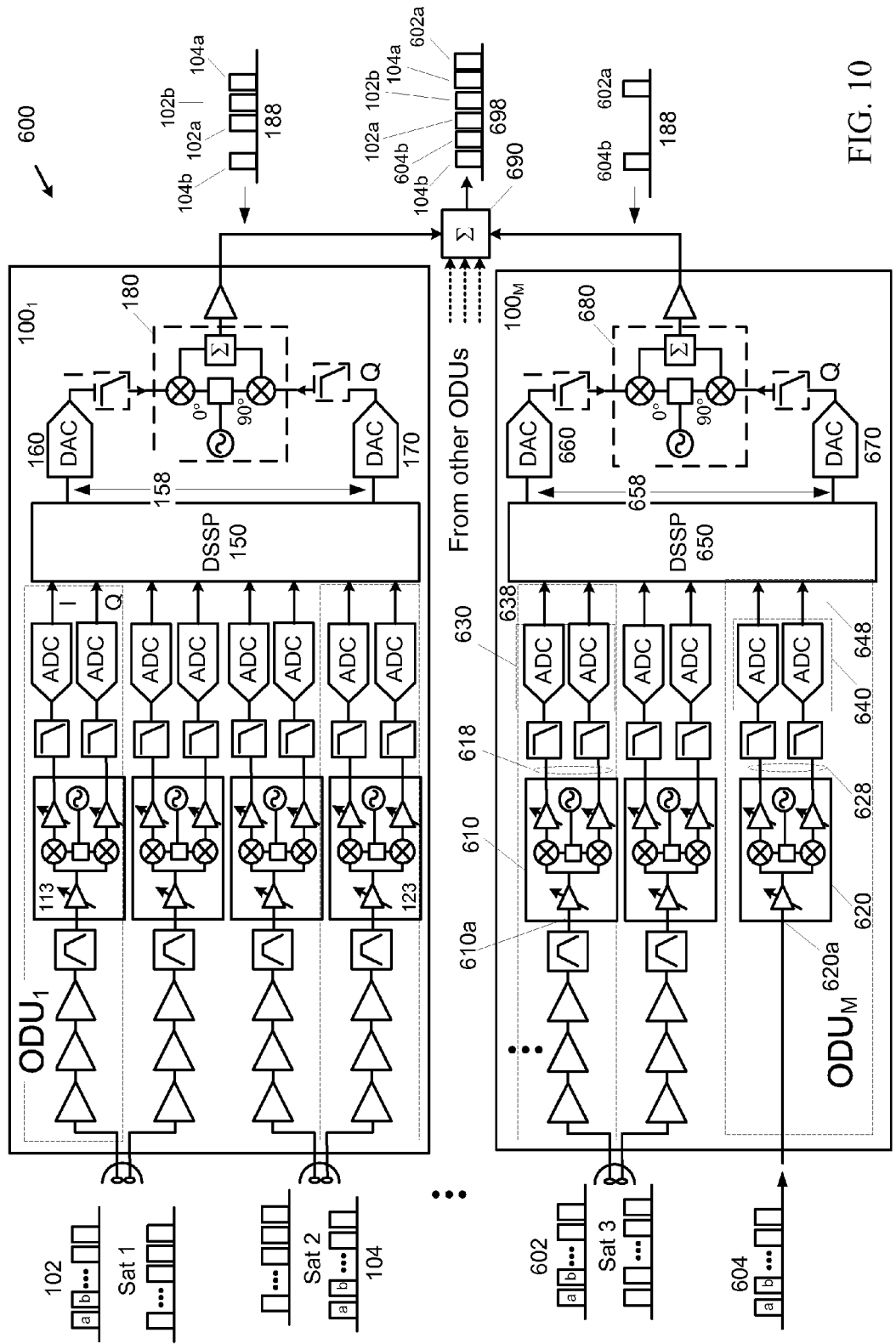
FIG. 10 illustrates a third embodiment of a channel stacking system.

FIG. 10 illustrates a third embodiment of a channel stacking system 600, with previously-identified features retaining their reference indicia. The system 600 includes a plurality of channel stacking sections which are coupled together in parallel by means of a signal combiner 690.

A first channel stacking section $100_1$ (system 100 in FIG. 4) or $ODU_1$ provides a first composite signal 188. An $M^{th}$ channel stacking section $100_M$ or $ODU_M$ provides an $M^{th}$ composite signal 688. The $M^{th}$ channel stacking section $100_M$ ($ODU_M$) includes a third downconverter 610 having an input 610a for receiving a third input signal 602 having a plurality of third channels 602a, 602b. The third downconverter 610 frequency downconverts the third input signal 602 to a third downconverted signal 618, signal 618 including the plurality of third channels 602a, 602b. Construction and operation of the third downconverter 610 is substantially similar to that of the first and second APD stage $107_1$ and $107_4$.

The $M^{th}$ channel stacking section $100_M$ further includes a third ADC 630 that converts the third downconverted signal 618 to a third digital downconverted signal 638. The third ADC 630 is substantially identical in construction and operation to the first ADC 108.

The $M^{th}$ channel stacking section $100_M$ further includes a fourth downconverter 620 having an input for receiving a fourth input signal 604 including a plurality of fourth channels 604a, 604b, the fourth downconverter 620 downconverts the fourth input signal 604 to a fourth downconverted signal 628, signal 628 including the plurality of the fourth channels 604a, 604b. A fourth ADC 640 converts the fourth downconverted signal 628 to a fourth digital downconverted signal 648. The fourth downconverter 620 and ADC 640 are substantially identical in construction and operation to the second downconverter 220 and ADC 240.

The $M^{th}$ channel stacking section $100_M$ further includes a second (or $M^{th}$) digital switching and signal processor 650 that receive each of the third and fourth digital downconverted signals 638, 648. Processor 650 assembles at least one of the third channels 602a, 602b and at least one of the fourth channels 604a, 604b into a second composite signal 658. Processor 650 is substantially identical in construction and operation to DSSP 150 of FIG. 4.

The $M^{th}$ channel stacking section $100_M$ also includes digital-to-analog converters (DACs) 660, 670, and an upconverter 680, which are substantially identical in construction and operation to DACs 160 and 170 and upconverter 180 of FIG. 4. The $M^{th}$ channel stacking section $100_M$ provides a second composite signal 688.

System 600 further includes a signal combiner 690 that combines the first and second composite signals 188 and 688 into a combined composite signal 698. In this manner any number of channel stacking sections may be implemented to provide different composite signals having a different mix of channels and/or channel sequences.

It is further noted that the post-DSP circuitry for each of the channel stacking sections $100_1$-$100_M$ is optional. In an alternative embodiment, DACs 160, 170, 660, 670, upconverters 180 and 680 are omitted, and signal combiner 690 operates in the digital domain to combine digital composite signals 158 and 658 to produce composite signal 698. DAC(s) and an upconverter circuit may be used to convert the resulting digital composite signal into the analog domain.

Figure 11:
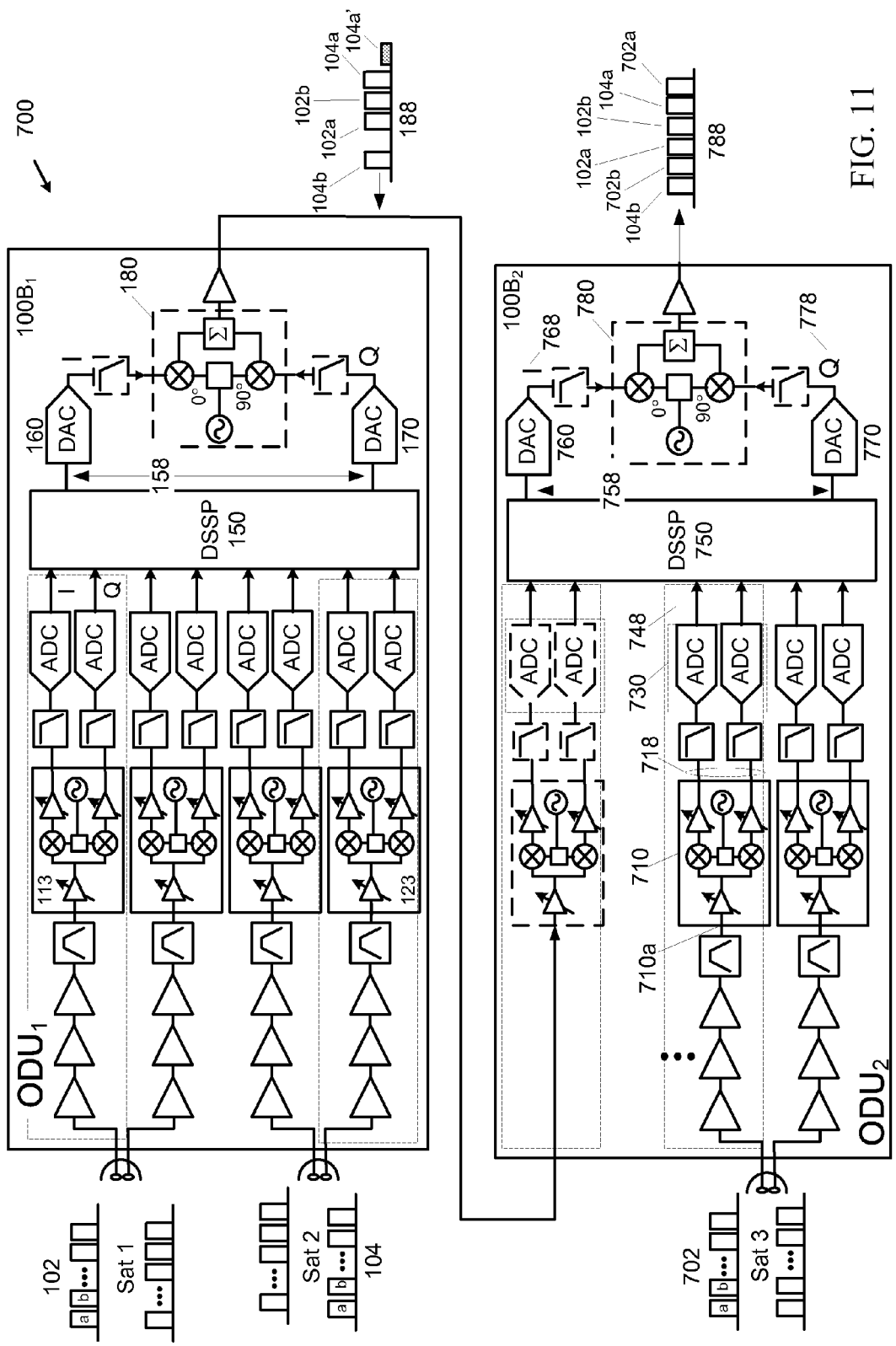
FIG. 11 illustrates a fourth embodiment of a channel stacking system.

FIG. 11 illustrates a fourth embodiment of a channel stacking system 700, with the previously identified features retaining their reference indicia. System 700 includes a plurality of channel stacking sections which are coupled serially.

A first channel stacking section $100_1$ (system 100 in FIG. 4) or $ODU_1$ provides a first composite signal 188. A second channel stacking section $100_2$ or $ODU_2$ adds one or more channels from a third signal 702 to the first composite signal 188 to produce a second composite signal 788. The second channel stacking section $100_2$ ($ODU_2$) includes a third downconverter 710 having an input 710a for receiving a third input signal 702 having a plurality of third channels 702a, 702b. The third downconverter 710 frequency downconverts the third input signal 702 to a third downconverted signal 718, signal 718 including the plurality of third channels 702a, 702b. Construction and operation of the third downconverter 710 is substantially similar to that of the first and second APD stage $107_1$ and $107_4$.

The second channel stacking section $100_2$ further includes a third ADC 730 that converts the third downconverted signal 718 to a third digital downconverted signal 748. The third ADC 730 is substantially identical in construction and operation to the first ADC 108. While the embodiment of FIG. 11 illustrates only one signal 702 received in addition to the first composite signal 188, it will be appreciated that additional signal sources (e.g., a source from Sat. 4) may be received as well, and in such an embodiment, the corresponding downconverting and ADC chains would be employed to capture channels included within these additional signals.

The second channel stacking section $100_2$ further includes a second digital switching and signal processor 750 that receives third digital downconverted signal 748 and the first composite signal 188 (in digital form via downconverter and ADCs 720). The second digital switching and signal processor 750 assembles at least one of the third channels 702a, 702b and at least one of the first or second channels 102a, 102b, 104a, 104b included within the first composite signal 188 into a second composite signal 758. In this manner any number of channel stacking sections may be serially coupled to provide different composite signals having a different mix of channels and/or channel sequences. Furthermore, the first composite signal 188, which provides relatively fewer channels, may be tapped and distributed to a first group of consumers to provide a basic service of channels, while the second composite signal 788, providing a larger number of channels may be distributed to a second group of consumers as a premium service.

As with the parallel channel stacking system 600 of FIG. 10, the post-DSSP circuitry for one or both of the channel stacking sections $100_1$ and $100_2$ are optional. For example, the DACs 160, 170, and upconverter 180 of the first channel stacking section $100_1$ may be omitted, and the downconverter and ADC circuits 720 of the second channel stacking section $100_2$ may be omitted, thereby allowing the digital composite signal 158 to be supplied directly to the second DSSP 750. The DACs 760 and 770 and upconverter circuit 780 may be used to convert the resulting second digital composite signal into the analog domain for distribution to an analog set top box or other receiver requiring an analog formatted signal. If a third channel stacking section $100_3$ (not shown) receives the second composite signal 788, the DACs 760 and 770 and upconverter 780 may be omitted or removed from the second channel stacking section $100_2$ and the second digital composite signal 758 supplied directly to the third processor housed within the third channel stacking section. The sequential coupling of additional channel stacking sections can be continued for any number of channel stacking sections.

In another embodiment, the reference frequency signal is selected such that no image signals are generated within the modulation bandwidth of the input signal, and in such a case, only a single ADC $108_1$ or $108_4$ is utilized. As an example, first APD stage $107_1$ receives Ku-band frequency signals operating over the frequency range of 12.2-12.7 GHz, and employs a reference generating a reference signal operating at either band end (i.e., 12.2 GHz or 12.7 GHz) to provide a zero-IF, 500 MHz wide IF signal 118. In this instance, ADC $108_1$ is a single ADC operating at a clock frequency of 1.1 GHz to provide the digital IF signal 118. Signals operating in the Ka-band frequency range may be similarly processed within the first APD stage $107_1$, in which the LO signal operates at bandends of either 17.3 GHz or 17.8 GHz. In one embodiment, the second APD stage $107_4$ is similar to the first APD stage $107_1$.

Figure 12:
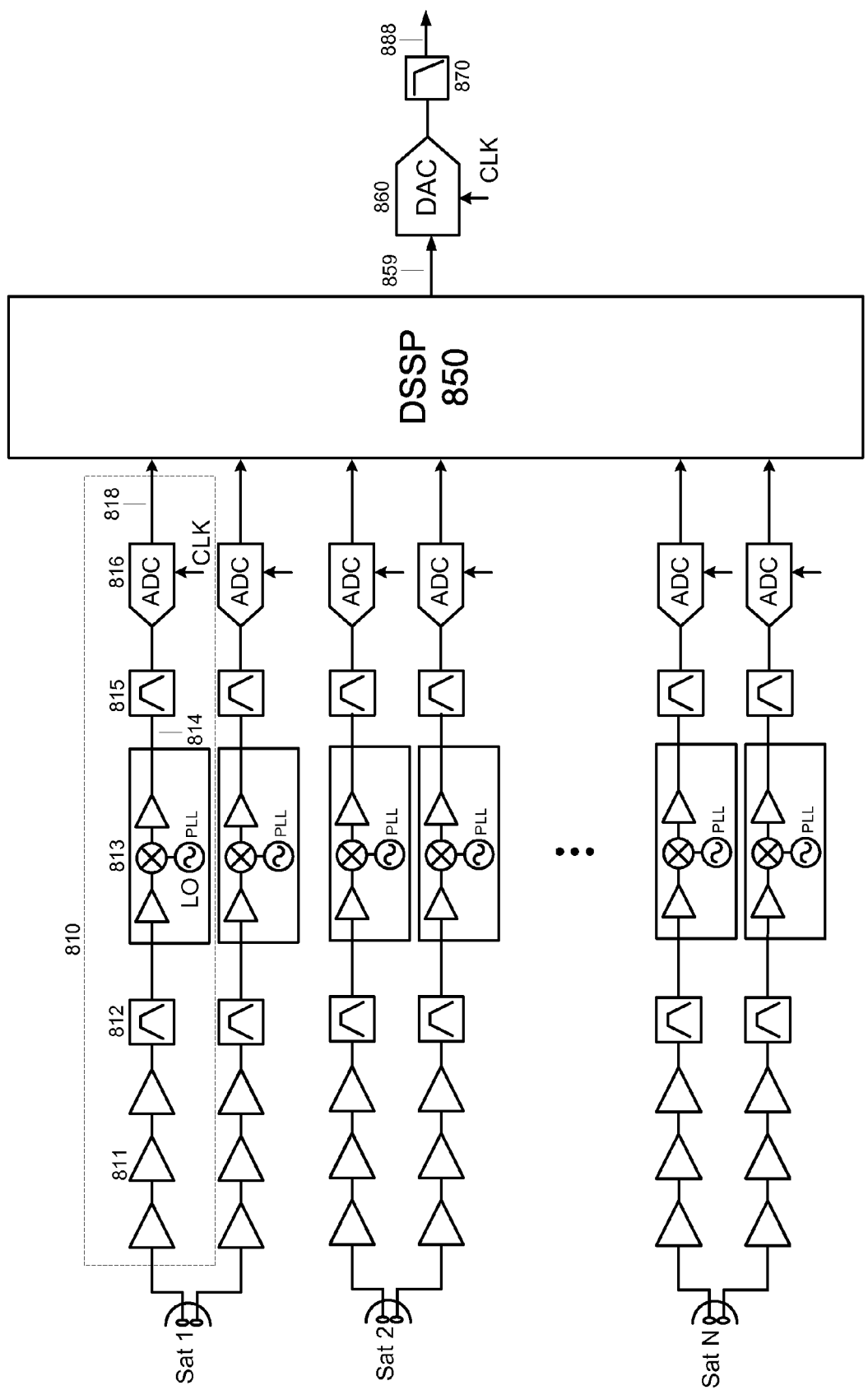
FIG. 12 illustrates a fifth embodiment of a channel stacking system.

FIG. 12 illustrates a fifth embodiment of a channel stacking system 800, with the previously identified features retaining their reference indicia. System 800 includes a plurality of downconverter stages, each of which may be constructed identically to downconverter stage 810. In particular, downconverter stage 810 operates as a low IF downconverter, whereby the frequency of the reference source within the downconverter circuit 813 is selected to provide a downconverted signal within a low-IF frequency range. The low-IF frequency range may range from 0.1-500 MHz, and more particularly 5-505 MHz, or for example 5-1005 MHz, or 5-2055 MHz in the case of wider bandwidth satellites. As the LO frequency is selected such that no image signals are generated within the modulation bandwidth of the downconverted signal 814, and accordingly a single version of the downconverted signal can be processed without the necessity of I and Q signal processing for subsequent image rejection. Construction and operation of the input RF amplifier 811, input RF filter 812, IF filter 815, and ADC 816 may be as described in the previous embodiments above. DSSP 850 operates to extract and place channels within desired channel slots to assemble a desired sequence of channels in an output digital signal 859. For this function a digital quadrature downconverter to zero IF, downconverting a selected channel from ADC output 818 line into I, Q ZIF signals and connecting these I, Q signals into 370/360 inputs of the Channel Extractor/Converter 350 of FIG. 7 can be utilized. DAC 860 operates to convert the digital output signal 859 to an analog form, and the output signal 888 is supplied to an analog receiver, such as to a cable set top box (not shown). An optional filter 870 (e.g., a lowpass filter) attenuates out-of-band interferers possibly produced by the DAC 860. As illustrated, the downconverter stage 810 operates as a single analog domain downconverter stage between the input RF signal and the output digital signal 859.

Figure 13:
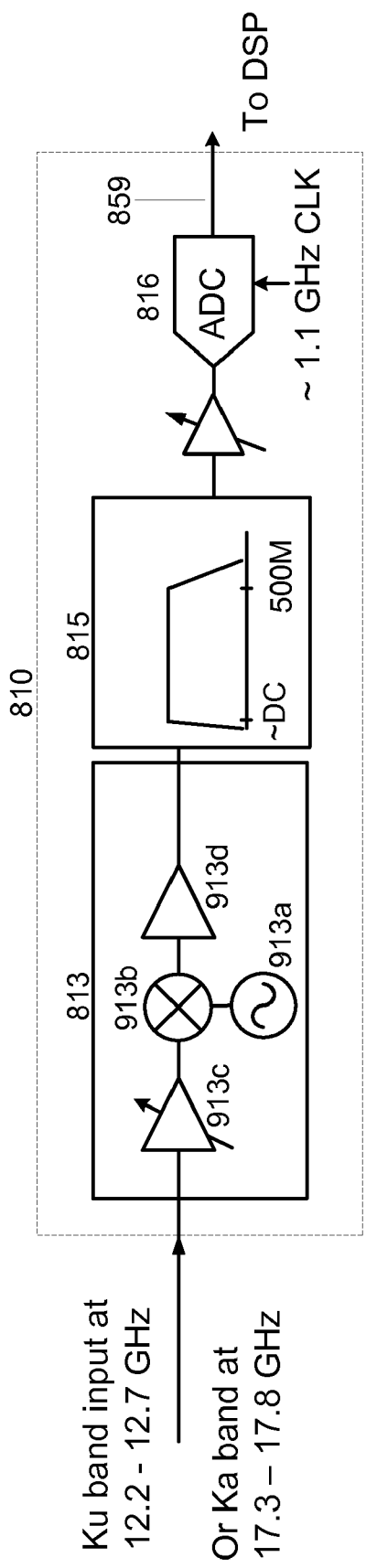
FIG. 13 illustrates portions of a downconverter stage.

FIG. 13 illustrates portions of a downconverter stage 810. The downconverter stage 810 includes a downconverter circuit 813, a filter 815 (e.g., a bandpass filter), and an ADC 816. Optionally, an amplifier (e.g., a variable gain amplifier) may be implemented prior to the ADC to control the input signal amplitude thereto.

Downconverter circuit 813 includes a reference 913a (e.g., a Phase Lock Loop oscillator), a mixer 913b, an input amplifier 913c (e.g., a variable gain amplifier) and an output amplifier 913d. In the described embodiments in which the input RF signal is a Ku or Ka-band of modulation width or approximately 500 MHz, filter 815 has approximately the same bandwidth, i.e., permits all channels to be passed therethrough.

ADC 816 is clocked at a sufficient rate to allow accurate sampling, consistent with Nyquist sampling criteria, e.g., 1.1 GHz for the 500 MHz modulation bandwidth. The digitized IF signal 818 is supplied to the DSSP 859, which extracts selected channels and assembles them into the desired channel sequence as described above.

Figure 14:
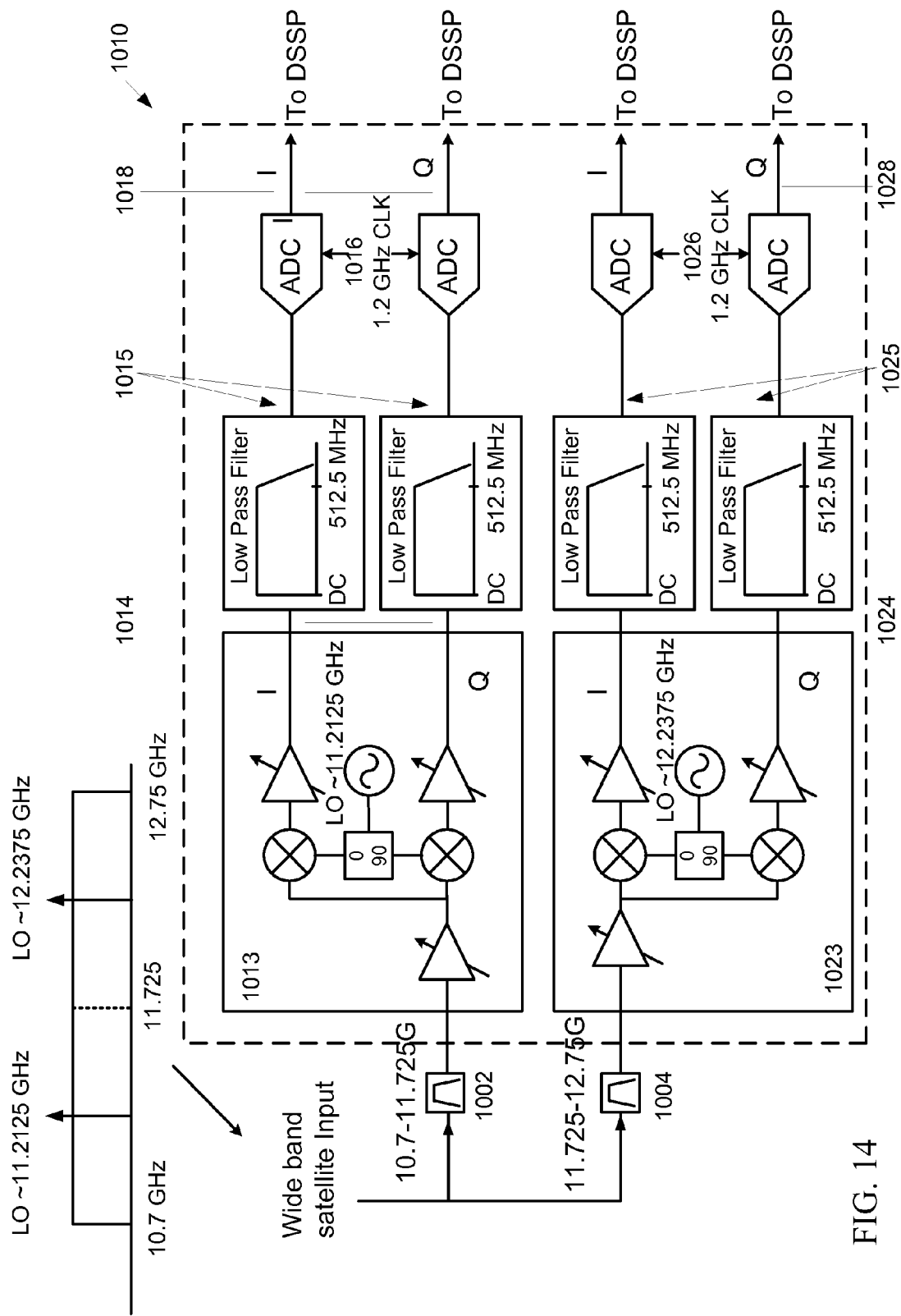
FIG. 14 illustrates a further embodiment of a first downconverter stage.

FIG. 14 illustrates a further embodiment of a first downconverter stage 1010. In one embodiment, the first downconverter stage 1010 processes wideband X-band signals which range between 10.7-11.725 GHz (lower X-band) and 11.725-12.75 GHz (upper X-band), although the stage 1010 could be modified to operate over other frequency ranges as well. The first downconverter stage 1010 is similar in operation to the first APD stage $107_1$ illustrated in FIG. 4, but utilizes two downconverter circuits 1013 and 1023 to downconvert both the upper and lower band portions of the wideband X-band input signal while employing relatively narrow band filtering and low sample rate ADCs.

As shown, the first downconverter stage 1030 includes filters (e.g., bandpass filters) 1002 and 1004 for supplying low and high portions of the applied input signal. In an alternative embodiment, a diplexer may be used. The lower X-band signal is supplied to first downconverter circuit 1013. The lower L-band signal is amplified and split into two portions, each of which are downconverted by respective mixers, which receive quadrature-phase reference signals originating from an source operating at approximately mid-band of the lower X-band frequency range, or 11.2125 GHz. The downconverted, quadrature-phased lower X-band signals 1014 are supplied to filters 1015, each having a passband of approximately 512 MHz. ADC pair 1016 are used to digitize the quadrature IF signals 1014 at a sufficient Nyquist rate, e.g., 1.2 GHz. The digitized IF signals 1018 are supplied to a DSSP (not shown) identical in construction to that shown in FIGS. 6 (if the LO is between channels) or 7 (if the LO is mid-channel) for channel extraction and placement.

The upper X-band signal output from filter 1004 is supplied to a second downconverter circuit 1023. The second downconverter circuit 1023 is configured and operates similarly to the first downconverter circuit 1013, although the reference frequency is tuned to mid-band of the upper X-band, or 12.2375 GHz. The downconverted, quadrature-phased upper X-band signals 1024 are supplied to filters 1025, each having a passband of approximately 512 MHz. ADC pair 1026 is used to digitize the quadrature IF signals 1024 at a sufficient Nyquist rate, e.g. 1.2 GHz. The digitized IF signals 1028 are supplied to a DSSP (not shown) identical in construction to that shown in FIGS. 6 (if the LO is between channels) or 7 (if the LO is mid-channel) for channel extraction and placement. In this manner, a relatively wideband RF input signal can be processed using relatively narrowband filtering and low sampling rate ADCs without signal degradation.

Figure 15:
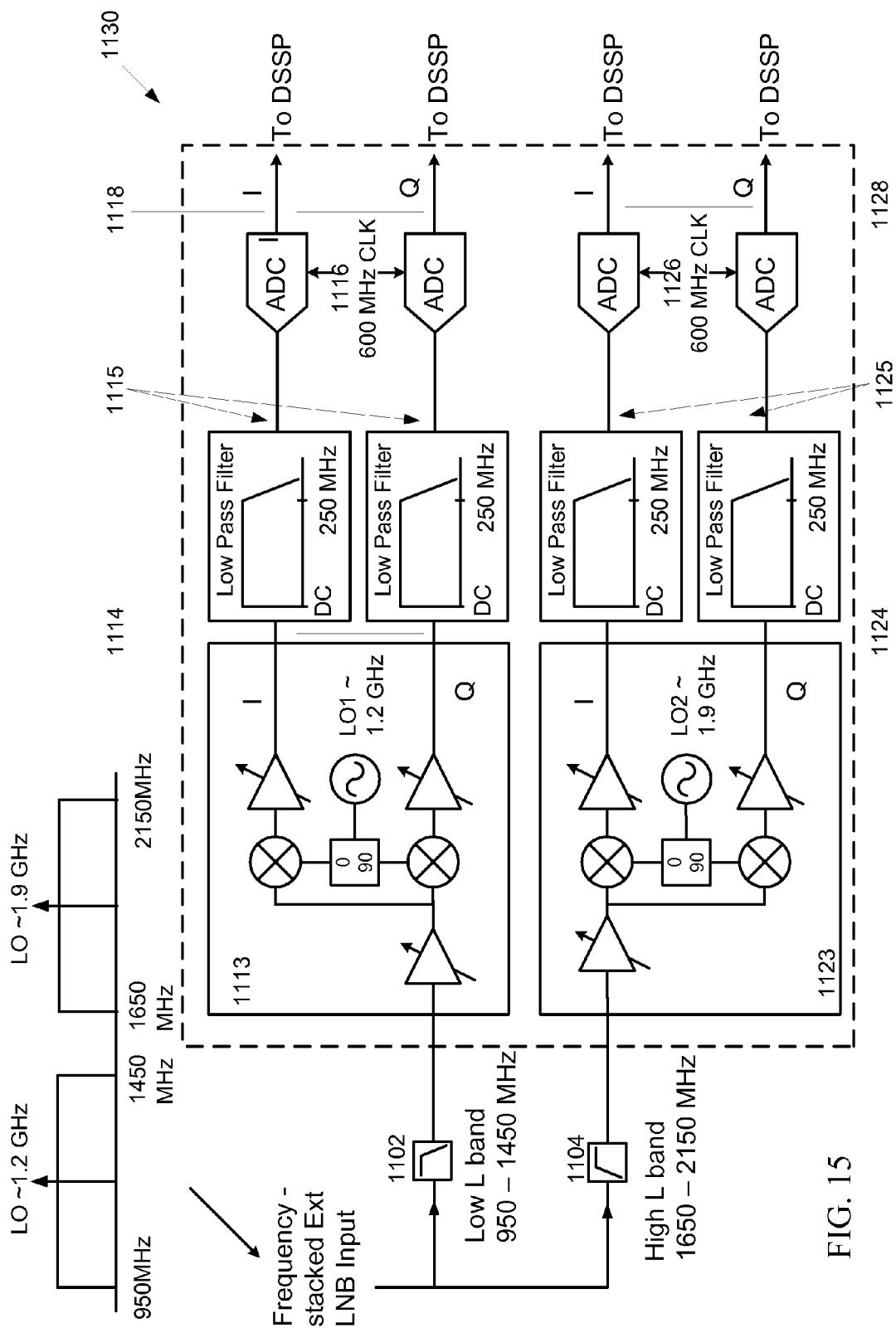
FIG. 15 illustrates a further embodiment of a third downconverter stage.

FIG. 15 illustrates a further embodiment of a third downconverter stage 1130. In a particular embodiment, the third downconverter stage 1130 processes L-band signals, specifically, signals ranging from 950-1450 MHz (lower L-band) and 1650-2150 MHz (upper L-band), although the stage 1130 could be modified to operate over other frequency ranges as well. The third downconverter stage 1130 is similar in operation to the third APD stage $107_M$ illustrated in FIG. 4, but utilizes two downconverter circuits 1113 and 1123 to downconvert both upper and lower L-band portions while employing relatively narrow band filtering and low sample rate ADCs.

As shown, the third downconverter stage includes filters 1102 and 1104 for supplying low and high portions of the applied input signal. In an alternative embodiment, a diplexer may be used. The lower L-band signal is supplied to first downconverter circuit 1113. The lower L-band signal is amplified and split into two portions, each of which are downconverted by respective mixers, which receive quadrature-phase reference signals originating from an source operating at approximately mid-band of the lower L-band frequency range, or 1.2 GHz. The downconverted, quadrature-phased lower L-band signals 1114 are supplied to filters 1115, each having a passband of approximately 250 MHz. ADC pair 1116 is used to digitize the quadrature IF signals 1114 at a sufficient Nyquist rate, e.g., 600 MHz. The digitized IF signals 1118 are supplied to a DSSP (not shown) identical in construction to that shown in FIGS. 6 (if the LO is between channels) or 7 (if the LO is mid-channel) for channel extraction and placement.

The upper L-band signal output from filter 1104 is supplied to a second downconverter circuit 1123. The second downconverter circuit 1123 is configured and operates similarly to the first downconverter circuit 1113, although the reference frequency is tuned to mid-band of the upper L-band, or 1.9 GHz. The downconverted, quadrature-phased upper L-band signals 1124 are supplied to filters 1125, each having a passband of approximately 250 MHz. ADC pair 1126 is used to digitize the quadrature IF signals 1124 at a sufficient Nyquist rate, e.g. 600 MHz. The digitized IF signals 1128 are supplied to a DSSP (not shown) identical in construction to that shown in FIGS. 6 (if the LO is between channels) or 7 (if the LO is mid-channel) for channel extraction and placement. In this manner, a relatively wideband signal can be processed using relatively narrowband filtering and low sampling rate ADCs without signal degradation.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosed system.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An storage medium is coupled to the processor such that the processor can read information from, and write information to, the storage medium. In the alternative, the storage medium may be integral to the processor.

Accordingly, one embodiment of the disclosed system can include a computer readable media embodying a method for channel stacking. Accordingly, the disclosed system is not limited to illustrated examples and any means for performing the functionality described herein are included in embodiments of the disclosed system.

While the foregoing disclosure shows illustrative embodiments of the disclosed system, it should be noted that various changes and modifications could be made herein without departing from the scope of the disclosed system. Furthermore, the invention shall be defined only by the appended claims. The functions, steps and/or actions of the claims need not be performed in any particular order. Furthermore, although elements of the invention may be claimed in the singular, the plural is contemplated unless limitation to the singular is explicitly stated.

What is claimed is:

1. A channel stacking system, comprising:
   a first downconverting stage, comprising:
   i) a first downconverter circuit having an input for receiving a first RF input signal comprising a plurality of first channels, the first downconverter frequency downconverts the first RF input signal to a first IF signal comprising said plurality of first channels using a single analog RF to IF frequency translation; and
   ii) a first analog-to-digital converter that converts the first IF signal to a first digital IF signal;
   a second downconverting stage, comprising:
   i) a second downconverter circuit having an input for receiving a second RF input signal comprising a plurality of second channels, the second downconverter circuit frequency downconverts the second RF input signal to a second IF signal comprising said plurality of second channels using a single analog RF to IF frequency translation; and
   ii) a second analog-to-digital converter that converts the second IF signal to a second digital IF signal; and
   a digital switching and signal processor that receives each of the first and second digital IF signals, the digital switching and signal processor digitally assembles at least one of the first channels and at least one of the second channels into a digital composite signal:
   a third downconverter having an input for receiving a third input signal comprising a plurality of third channels, the third downconverter frequency downconverts the third input signal to a third downconverted signal comprising said plurality of third channels:
   a third analog-to-digital converter that convert the third downconverted signal to a third digital downconverted signal: and
   a second digital switching and signal processor that receives the third digital downconverted signal and the first composite signal, the second digital switching and signal processor assembles at least one of the third channels and at least one of the first or second channels into a second composite signal.

2. The channel stacking system of claim 1, wherein the single analog RF to IF frequency translation comprising converting a Ku-band signal to a signal having a frequency below 3 Gigahertz.

3. The channel stacking system of claim 1, further comprising a third downconverting stage, comprising:
   a) a third downconverter circuit having an input for receiving an IF input signal comprising a plurality of third channels, the third downconverter circuit frequency downconverts the IF input signal to a third IF signal comprising said plurality of third channels; and b) a third analog-to-digital converter that converts the third IF signal to a third digital IF signal.

4. The channel stacking system of claim 3, wherein the first, second, and third downconverter circuits are zero-IF downconverter circuits, and wherein the first, second and third IF signals comprise a baseband signal substantially centered around 0 Hz.

5. The channel stacking system of claim 1, further comprising respective first and second reference frequency sources for providing respective first and second reference signals to the respective first and second downconverter stages.

6. The channel stacking system of claim 5, wherein the first and second reference frequency sources are variable frequency sources.

7. The channel stacking system of claim 1, wherein the first downconverted signal comprises a pair of quadrature phase signals, and wherein the second downconverted signal comprises a pair of quadrature phase signals.

8. The channel stacking system of claim 1, wherein the composite signal comprises a pair of digital quadrature phase signals output from the digital switching and signal processor.

9. The channel stacking system of claim 8, further comprising:
   a) first and second digital-to-analog converters that receives a respective one of the digital quadrature phase signals and to produce a respective one of two quadrature phase analog composite signals; and
   b) an upconverter receives each of the analog quadrature phase composite signals, and produces an upconverted composite signal.

10. The channel stacking system of claim 1, wherein the first input signal comprises a signal received in the X-band, Ku-band, or Ka-band frequency range, and the second input signal comprises a signal received in the L-band frequency range.

11. The channel stacking system of claim 1, wherein the first composite signal comprises a digital signal, the channel stacking system further comprising:
   digital-to-analog circuitry that receives the first digital composite signal, and to convert the first digital composite signal into a first analog composite signal; and
   an analog-to-digital converter that converts the first analog signal to a digital signal which is input into the second digital switching and signal processor.

12. A channel stacking system comprising:
   a first downconverting stage, comprising:
   i) a first downconverter circuit having an input for receiving a first RF input signal comprising a plurality of first channels, the first downconverter frequency downconverts the first RF input signal to a first IF signal comprising said plurality of first channels using a single analog RF to IF frequency translation: and
   ii) a first analog-to-digital converter that converts the first IF signal to a first digital IF signal:
   a second downconverting stage, comprising:
   i) a second downconverter circuit having an input for receiving a second RF input signal comprising a plurality of second channels, the second downconverter circuit frequency downconverts the second RF input signal to a second IF signal comprising said plurality of second channels using a single analog RF to IF frequency translation: and
   ii) a second analog-to-digital converter that converts the second IF signal to a second digital IF signal: and
   a digital switching and signal processor that receives each of the first and second digital IF signals, the digital switching and signal processor digitally assembles at least one of the first channels and at least one of the second channels into a first composite signal;
a third downconverter having an input for receiving a third input signal comprising a plurality of third channels, the third downconverter frequency downconverts the third input signal to a third downconverted signal comprising said plurality of third channels;
a third analog-to-digital converter converts the third downconverted signal to a third digital downconverted signal;
a fourth downconverter having an input for receiving a fourth input signal comprising a plurality of fourth channels, the fourth downconverter frequency downconverts the fourth input signal to a fourth downconverted signal comprising said plurality of fourth channels;
a fourth analog-to-digital converter that converts the fourth downconverted signal to a fourth digital downconverted signal;
a second digital switching and signal processor that receives each of the third and fourth digital downconverted signals, the second digital switching and signal processor assembles at least one of the third channels and at least one of the fourth channels into a second composite signal; and
a signal combiner that combines the first and second composite signals into a combined composite signal.

13. A method for assembling channels in a composite signal, the method comprising:
downconverting, in a single frequency translation process, a first input signal comprising a first plurality of channels to a first IF signal comprising said plurality of first channels;
converting the first IF signal into a first digital IF signal;
downconverting, in a single frequency translation process, a second input signal comprising a plurality of second channels to a second IF signal comprising said plurality of second channels;
converting the second IF signal into a second digital IF signal;
assembling, in the digital domain, at least one of the first channels and at least one of the second channels into a digital composite signal;
downconverting, in a single frequency translation process, a third input signal comprising a third plurality of channels to a third IF signal comprising said plurality of third channels;
converting the third IF signal into third digital IF signal; and
assembling, in the digital domain, at least one of the third channels and at least one of the first or second channels into a second composite signal.

14. The method of claim 13, wherein the first and second IF signals are downconverted to a zero intermediate frequency using a single frequency translation.

15. The method according to claim 14, further comprising:
converting the first and second IF signals into complex IF signals having in-phase (I) and quadrature (Q) components.

16. The method of claim 13, further comprising:
a) providing access to the channels within the first and second digital IF signals to a plurality of receivers; and
b) extracting channels of interest from the plurality of channels in the first and second digital IF signals.

17. The method of claim 16, wherein providing access to the channel of interest further comprises digitally switching between each digital IF signal and each one of the plurality of receivers.

18. The method of claim 16, further comprising:
a) upconverting digitally each channel of interest to a unique intermediate output frequency; and
b) summing digitally the upconverted channels of interest to form a digital composite signal.

19. The method of claim 18, further comprising:
a) converting the digital composite signal to an analog composite signal; and
b) upconverting the analog composite signal to an output center frequency.

* * * * *